(12) United States Patent
Kagumba et al.

(10) Patent No.: US 12,391,024 B2
(45) Date of Patent: Aug. 19, 2025

(54) LOW-DIELECTRIC CONSTANT, LOW-DISSIPATION FACTOR LAMINATES INCLUDING AEROGEL LAYERS

(71) Applicant: Blueshift Materials, Inc., Spencer, MA (US)

(72) Inventors: Lawino Kagumba, Spencer, MA (US); Vitaly Benkin, Spencer, MA (US); Garrett Poe, Spencer, MA (US)

(73) Assignee: BLUESHIFT MATERIALS, INC., Spencer, MA (US)

( * ) Notice: Subject to any disclaimer, the term of this patent is extended or adjusted under 35 U.S.C. 154(b) by 150 days.

(21) Appl. No.: 17/924,560

(22) PCT Filed: May 17, 2021

(86) PCT No.: PCT/US2021/032728
§ 371 (c)(1),
(2) Date: Nov. 10, 2022

(87) PCT Pub. No.: WO2021/232001
PCT Pub. Date: Nov. 18, 2021

(65) Prior Publication Data
US 2023/0173791 A1    Jun. 8, 2023

Related U.S. Application Data

(60) Provisional application No. 63/025,947, filed on May 15, 2020.

(51) Int. Cl.
*B32B 15/08*    (2006.01)
*B32B 5/02*     (2006.01)
(Continued)

(52) U.S. Cl.
CPC .............. *B32B 15/08* (2013.01); *B32B 5/022* (2013.01); *B32B 5/024* (2013.01); *B32B 5/18* (2013.01);
(Continued)

(58) Field of Classification Search
None
See application file for complete search history.

(56) References Cited

U.S. PATENT DOCUMENTS 9,963,571 B2    5/2018    Sakaguchi et al.
10,500,557 B2   12/2019   Sakaguchi et al.
(Continued)

FOREIGN PATENT DOCUMENTS

CA    2968994    12/2017
CN    1196036    10/1998
(Continued)

OTHER PUBLICATIONS

International Search Report & Written Opinion issued in International Application No. PCT/US2021/032728, dated Oct. 15, 2021.
(Continued)

*Primary Examiner* — Chinessa T. Golden
(74) *Attorney, Agent, or Firm* — NORTON ROSE FULBRIGHT US LLP

(57) ABSTRACT

A laminate comprises one or more electrically-conductive layers and one or more electrically-insulative layers coupled to the electrically-conductive layer(s). Each of the electrically-conductive layer(s) can comprise at least 90% by weight of copper. Each of the electrically-insulative layer(s) can comprise a layer of polymeric aerogel. For at least one of opposing front and back surfaces of the laminate, at least a portion of the surface is defined by one of the electrically-conductive layer(s).

26 Claims, 7 Drawing Sheets

(51) Int. Cl.
  *B32B 5/18* (2006.01)
  *B32B 7/12* (2006.01)
  *B32B 15/092* (2006.01)
  *B32B 15/20* (2006.01)
  *B32B 27/06* (2006.01)
  *B32B 27/10* (2006.01)
  *B32B 27/12* (2006.01)
  *B32B 27/28* (2006.01)
  *B32B 27/32* (2006.01)
  *B32B 27/38* (2006.01)
  *H01Q 1/38* (2006.01)
  *H05K 1/02* (2006.01)
  *H05K 1/03* (2006.01)

(52) U.S. Cl.
  CPC .............. *B32B 7/12* (2013.01); *B32B 15/092* (2013.01); *B32B 15/20* (2013.01); *B32B 27/065* (2013.01); *B32B 27/10* (2013.01); *B32B 27/12* (2013.01); *B32B 27/281* (2013.01); *B32B 27/322* (2013.01); *B32B 27/38* (2013.01); *H01Q 1/38* (2013.01); *H05K 1/0243* (2013.01); *H05K 1/0366* (2013.01); *B32B 2266/0214* (2013.01); *B32B 2266/102* (2016.11); *B32B 2266/104* (2016.11); *B32B 2266/126* (2016.11); *B32B 2307/202* (2013.01); *B32B 2307/204* (2013.01); *B32B 2307/206* (2013.01); *B32B 2307/546* (2013.01); *B32B 2307/72* (2013.01); *B32B 2307/732* (2013.01); *B32B 2457/08* (2013.01); *H05K 2201/0154* (2013.01)

(56) References Cited

U.S. PATENT DOCUMENTS

| | | | | |
|---|---|---|---|---|
| 2003/0077438 | A1* | 4/2003 | Frank | C04B 28/26 428/331 |
| 2013/0249073 | A1* | 9/2013 | Chen | H01L 23/3128 438/126 |
| 2017/0121483 | A1 | 5/2017 | Poe et al. | |
| 2017/0245380 | A1* | 8/2017 | Yun | H01L 23/564 |
| 2017/0355829 | A1* | 12/2017 | Sakaguchi | B01J 13/0091 |
| 2018/0022061 | A1* | 1/2018 | Kotake | F16L 59/029 428/317.9 |
| 2018/0290118 | A1* | 10/2018 | Sakaguchi | B32B 5/22 |
| 2018/0319138 | A1 | 11/2018 | Ukei et al. | |
| 2019/0030873 | A1 | 1/2019 | Takayasu et al. | |
| 2021/0050279 | A1 | 2/2021 | Wu et al. | |

FOREIGN PATENT DOCUMENTS

| | | | |
|---|---|---|---|
| CN | 1335805 | 2/2002 | |
| CN | 207310734 | 5/2018 | |
| CN | 108602305 | 9/2018 | |
| CN | 110408337 | 11/2019 | |
| CN | 110944744 | 3/2020 | |
| JP | 2000154273 | 6/2000 | |
| JP | 2002185093 | 6/2002 | |
| JP | 2005294829 | 10/2005 | |
| WO | WO 2014/189560 | 11/2014 | |
| WO | WO 2016/121757 | 8/2016 | |
| WO | WO 2017/078888 | 5/2017 | |
| WO | WO 2018/078512 | 5/2018 | |
| WO | WO 2018/140804 | 8/2018 | |
| WO | WO 2018/200838 | 11/2018 | |
| WO | WO 2019/006184 | 1/2019 | |
| WO | WO 2019/210094 | 10/2019 | |
| WO | WO-2019216869 A1 * | 11/2019 | ............... B32B 7/12 |

OTHER PUBLICATIONS

Office Action issued in Corresponding European Application No. 21732630.5, dated Dec. 22, 2023.
Office Action issued in corresponding Japanese Application No. 2022-569055, dated Apr. 21, 2025 (English Translation provided).
Office Action and Search Report issued in corresponding Chinese Application No. 202180045890.6, dated Apr. 2, 2025 (English Translation provided).

* cited by examiner

LOW-DIELECTRIC CONSTANT, LOW-DISSIPATION FACTOR LAMINATES INCLUDING AEROGEL LAYERS

CROSS REFERENCE TO RELATED APPLICATIONS

This application is a national phase application under 35 U.S.C. § 371 of International Application No. PCT/US2021/032728, filed May 17, 2021, which claims the benefit to U.S. Provisional Application No. 63/025,947 filed May 15, 2020, the contents of each of which are incorporated herein in their entirety and without disclaimer.

BACKGROUND OF THE INVENTION

A. Field of the Invention

The present invention relates generally to copper-clad laminates for use in high-frequency (e.g., 10-300 GHz) electrical applications such as communication systems, antenna systems, electrical amplifiers, radar systems, and/or the like.

B. Description of Related Art

Copper-clad laminates are often used in printed circuit boards (PCBs). Traditionally, a copper-clad laminate includes one or more thin (e.g., less than 4.5 thousandths of an inch (mils)) copper layers, at least one of which defines an outer surface of the laminate, and one or more insulative substrates that can provide structural support for the copper layer(s). To make a PCB, each of the copper layer(s) can be etched to define separate conducting lines or "traces" through which electricity can flow between different components attached to the PCB.

A copper-clad laminate's substrate properties can affect PCB durability and electrical performance. For example, a laminate may be heated as components are soldered to the PCB or when the PCB is in use. Thermal expansion of the substrate—particularly when the temperature thereof is raised above its glass transition temperature ($T_g$)—can cause delamination of the copper layer(s) and/or breakage of joints connecting components to the PCB. Additionally, the rate at which signals can be propagated through the PCB and the amount of the signals' electromagnetic energy lost to the PCB is affected by the laminate's dielectric constant ($D_k$) and dissipation factor ($D_f$).

Substrates used in PCBs include woven or nonwoven glass fibers dispersed in an epoxy resin, polytetrafluoroethylene (PTFE), and paper (e.g., phenolic paper) impregnated with a phenol formaldehyde resin. While copper-clad laminates incorporating one or more of such substrates often have relatively low dissipation factors that can mitigate dielectric losses (e.g., between 0.0009 and 0.0018, at 10 GHz), their dielectric constants are greater than 2.0. For example, copper-clad laminates with PTFE substrates typically have a dielectric constant that is between 2.2 and 2.3 at 10 GHz. With dielectric constants greater than 2.0, PCBs using conventional copper-clad laminates may not be able to propagate signals at an adequate rate to maintain signal integrity in high-frequency applications such as 5G communications systems and high-speed digital circuits. Accordingly, there is a need in the art for copper-clad laminates having ultra-low dielectric constants that are suitable for use in PCBs.

SUMMARY OF THE INVENTION

To address this need in the art, some of the present laminates include one or more electrically-conductive layers that each comprise at least 90% by weight of copper and one or more electrically-insulative layers that are coupled to the electrically-conductive layer(s). In some aspects, at least one of the electrically-insulative layer(s), can contain a porous material. In some aspects, the electrically-insulative layer(s) each can independently contain a porous material. In certain aspects, the porous material can be an open celled porous material. In certain other aspects, the porous material can be a closed celled porous material. In certain aspects, the porous material can be a foam. In certain aspects, the foam can be an organic or silicone foam. Non-limiting examples of the organic foam can include polyurethane, polystyrene, polyvinyl chloride, (meth)acrylic polymer, polyamide, polyimide, polyaramide, polyurea, polyester, polyolefin (such as polyethylene, polypropylene, ethylene propylene diene monomer (EPDM) foam, or the like), polyethylene terephthalate, polybutylene terephthalate, polyvinyl chloride, polyvinyl acetate, ethyl vinyl alcohol (EVOH), ethylene-vinyl acetate (EVA), polymethyl methacrylates, polyacrylates, polycarbonates, polysulphonates, or synthetic rubber foam, or any combinations thereof. In certain aspects, the foam can be a polyurethane foam. In certain aspects, the porous material can be an aerogel. In some laminates, the electrically-insulative layer(s) each can comprise a layer of polymeric aerogel. With such aerogel layer(s), the laminate can have an ultra-low dielectric constant (e.g., that is less than 2.0, such as less than or equal to 1.7 at 10 GHz) and dissipation factor (e.g., that is less than or equal to 0.002 at 10 GHz), making it suitable for high-frequency electrical applications.

The composition of the aerogel layer(s) can promote the laminate's heat resistance to render it suitable for use in PCBs. For example, in some embodiments, for at least one of the electrically-insulative layer(s), the layer of polymeric aerogel has a thermal decomposition temperature that is at least 400° C., 450° C., or 500° C. In some embodiments, for at least one of the electrically-insulative layer(s), the layer of polymeric aerogel comprises at least 90% by weight of an organic polymer and/or at least 90% by weight of polyimide, polyamide, polyaramid, polyurethane, polyurea, and/or polyester. In some embodiments, for at least one of the electrically-insulative layer(s), the layer of polymeric aerogel comprises an open-cell structure and/or comprises micropores, mesopores, and/or macropores. The aerogel layer, in some embodiments, has a pore volume, where at least 10%, at least 50%, at least 75%, or at least 95% of the pore volume is made up of micropores, mesopores, and/or macropores. For at least one of the electrically-insulative layer(s), in some embodiments, the layer of polymeric aerogel has an average pore diameter that is between 2 nm and 50 nm or between 50 nm and 5,000 nm, optionally between 100 nm and 800 nm, between 100 nm and 500 nm, between 150 nm and 400 nm, between 200 nm and 300 nm, or between 225 nm and 275 nm. Such laminates may accordingly be able to withstand heat during PCB manufacturing (e.g., from soldering) and during PCB use.

Additionally, in some embodiments, at least one of the aerogel layer(s) has a thickness that is less than or equal to 20 mils, less than or equal to 12 mils, or less than or equal to 7 mils, such as between 3 mils and 20 mils, between 3 mils and 15 mils, between 3 mils and 12 mils, or between 3 mils and 7 mils. Such relatively thin aerogel layer(s) can facilitate the laminate's low dielectric constant and low dissipation factor. To illustrate, in some embodiments, at least one of the aerogel layer(s) has i) a dielectric constant any one of, at most any one of, or between any two of 3, 2.75, 2.5, 2.25, 2, 1.75, 1.6, 1.4, 1.3, 1.2 and 1.1 at 10 GHz; and/or a dissipation factor any one of, at most any one of, or between any two of 0.005, 0.004, 0.003, 0.0025, 0.00225, 0.002, 0.00175, 0.0015, 0.00125, 0.001, 0.00075, and 0.0005 at 10 GHz. To illustrate, in some embodiments, a dielectric constant of the laminate, at 10 GHz, is less than or equal to 2.0, less than or equal to 1.9, less than or equal to 1.8, less than or equal to 1.75, less than or equal to 1.7, or less than or equal to 1.6 and/or a dissipation factor of the laminate, at 10 GHz, is less than or equal to 0.0025, less than or equal to 0.00225, less than or equal to 0.002, less than or equal to 0.00175, or less than or equal to 0.0015.

In some aspects, at least one or more of the electrically-insulative layer(s) can comprise fibers without a porous material of the present invention. In other aspects, at least one or more of the electrically-insulative layer(s) can comprise a combination of fibers with a porous material of the present invention (e.g., fibers dispersed or aligned within a porous material). The fibers can be natural, synthetic, semi-synthetic fibers, or combinations thereof. The fibers can comprise vegetable, wood, animal, mineral, biological fibers, or combinations thereof. In some particular instances, the fibers can comprise rayon, bamboo, diacetate, triacetate fibers, polyester fibers, aramid fibers, or combinations thereof. In some embodiments, the fibers comprise metal fibers, carbon fibers, carbide fibers, glass fibers, mineral fibers, basalt fibers, or combinations thereof. In some embodiments, the fibers comprise thermoplastic polymer fibers, thermoset polymer fibers, or combinations thereof. Non-limiting examples of thermoplastic fibers includes fibers of polyethylene terephthalate (PET), a polycarbonate (PC) family of polymers, polybutylene terephthalate (PBT), poly(1,4-cyclohexylidene cyclohexane-1,4-dicarboxylate) (PCCD), glycol modified polycyclohexyl terephthalate (PCTG), poly(phenylene oxide) (PPO), polypropylene (PP), polyethylene (PE), polyvinyl chloride (PVC), polystyrene (PS), polymethyl methacrylate (PMMA), polyethyleneimine or polyetherimide (PEI) and their derivatives, thermoplastic elastomer (TPE), terephthalic acid (TPA) elastomers, poly (cyclohexanedimethylene terephthalate) (PCT), polyethylene naphthalate (PEN), polyamide (PA), polysulfone sulfonate (PSS), sulfonates of polysulfones, polyether ether ketone (PEEK), polyether ketone ketone (PEKK), acrylonitrile butyldiene styrene (ABS), polyphenylene sulfide (PPS), co-polymers thereof, or blends thereof. Non-limiting examples of thermoset fibers include a fiber of unsaturated polyester resins, polyurethanes, polyoxybenzylmethylenglycolanhydride (e.g., bakelite), urea-formaldehyde, diallylphthalate, epoxy resin, epoxy vinylesters, polyimides, cyanate esters of polycyanurates, dicyclopentadiene, phenolics, benzoxazines, co-polymers thereof, or blends thereof. In some embodiments, the fibers are polyaramid, polyimide, polybenzoxazole, polyurethane, or blends thereof. In some embodiments, the fibers are vinylon. In some embodiments, the fibers are polyester fibers. In some embodiments, the fibers are non-woven. In some embodiments, the fibers form a fiber matrix. In some embodiments, the fibers have an average filament cross sectional area of 5 $\mu m^2$ to 40,000 $\mu m^2$ and an average length of 20 mm to 100 mm. In some embodiments, the cross sectional area is 5, 10, 15, 20, 25, 50, 100, 150, 200, 250, 300, 350, 400, 450, or 500 $\mu m^2$ or between any two of those values. In some embodiments, the fibers have an average length of approximately 0.1, 0.2, 0.3, 0.4, 0.5, 1, 2, 3, 4, 5, 6, 7, 8, 9, 10, 20, 30, 40, 50, 60, 70, 80, 90, 100, 150, 200, 250, 300, 350, 400, 450, 500, 600, 700, 800, 900, 1000, 1500, 2000, 3000, 4000, 5000 mm or between any two of those values. Bundles of various kinds of fibers can be used depending on the use intended for the internally reinforced aerogel. For example, the bundles may be of carbon fibers or ceramic fibers, or of fibers that are precursors of carbon or ceramic, glass fibers, aramid fibers, or a mixture of different kinds of fiber. Bundles can include any number of fibers. For example, a bundle can include 400, 750, 800, 1375, 1000, 1500, 3000, 6000, 12000, 24000, 50000, or 60000 filaments. The fibers can have a filament diameter of 5 to 24 microns, 10 to 20 microns, or 12 to 15 microns or any range there between, or 5, 6, 7, 8, 9, 10, 11, 12, 13, 14, 15, 16, 17, 18, 19, 20, 21, 22, 23, 24 microns or any value there between. The fibers in a bundle of fibers can have an average filament cross sectional area of 7 $\mu m^2$ to 800 $\mu m^2$, which equates to an average diameter of 3 to 30 microns for circular fibers. In some embodiments, the fiber matrix comprises felt, batting, non-woven fabric, or a mat.

The electrically-conductive layer(s) can have a suitable thickness for propagating electrical signals. In some embodiments, at least one of the electrically-conductive layer(s) has a thickness that is between 0.5 mils and 3 mils, 0.5 mils and 2 mils, or between 0.5 mils and 0.9 mils, between 1 mil and 2 mils, 1.4 mils, or approximately 0.7 mils. At least one of the electrically-conductive layer(s), in some embodiments, has an area density of between 0.35 and 3 ounces per square foot (oz/ft$^2$) or between 0.35 and 0.75 oz/ft$^2$, such as approximately 0.5 oz/ft$^2$.

In some embodiments, the laminate comprises one or more adhesive layers, each disposed between adjacent ones of the electrically-conductive layer(s) and electrically-insulative layer(s). The adhesive layer(s) can bond the other layers together and have properties to promote the electrical performance of the laminate and mitigate delamination. To illustrate, in some embodiments, at least one of the adhesive layer(s) comprises a fluoropolymer film, at least one of the adhesive layer(s) comprises a polyimide film, and/or at least one of the adhesive layer(s) comprises a B-stage epoxy. At least one of the adhesive layer(s), in some embodiments, has dielectric constant at 10 GHz that is less than or equal to 3.5, less than or equal to 3.0, less than or equal to 2.5, or less than or equal to 2.25 and/or a dissipation factor at 10 GHz that is less than or equal to 0.0040, less than or equal to 0.0035, less than or equal to 0.0030, less than or equal to 0.0025, less than or equal to 0.0020, or less than or equal to 0.0015. In some embodiments, at least one of the adhesive layer(s) has a decomposition temperature that is greater than or equal to 350° C., greater than or equal to 375° C., greater than or equal to 400° C., greater than or equal to 450° C., or greater than or equal to 500° C. and/or a glass transition temperature or a melting point that is greater than or equal to 100° C., greater than or equal to 150° C., greater than or equal to 200° C., greater than or equal to 225° C., greater than or equal to 250° C., or greater than or equal to 275° C. At least one of the adhesive layer(s), in some embodiments, has a thickness that is between 0.3 mils and 5 mils, between 0.3 mils and 3.0 mils, between 0.3 mils and 2.0 mils, between 0.3 mils and 1.2 mils, or between 0.75 and 1.25 mils.

Aerogels, and thus the laminate, can be relatively flexible. For example, in some embodiments, the laminate is disposed in a roll such that a portion of a front surface of the laminate faces a portion of the back surface of the laminate. In some of such embodiments—with a laminate sufficiently flexible to be disposed in a roll—the laminate can be used in a flexible circuit board. In other embodiments, however, the laminate can have a sufficiently high rigidity such that it is not rollable. For example, in some embodiments, the laminate comprises one or more reinforcing layers. Each of the reinforcing layer(s), in some embodiments, has a flexural rigidity that is at least 10% larger than a flexural rigidity of each of the electrically-conductive layer(s) and the electrically-insulative layer(s). In some embodiments, for at least one of the electrically-insulative layer(s), at least one of the reinforcing layer(s) is at least partially embedded in the layer of polymeric aerogel, optionally such that the Young's modulus of the electrically-insulative layer is at least 200 MPa. At least one of the reinforcing layer(s), in some embodiments, comprises one or more unidirectional, non-woven, or woven sheets, each comprising fibers. For at least one of the electrically-insulative layer(s), in some embodiments, a plurality of fibers are dispersed in the layer of polymeric aerogel, optionally such that the Young's modulus of the electrically-insulative layer is at least 200 MPa. At least one of the reinforcing layer(s), in some embodiments, comprises one or more paper sheets. In other embodiments, however, the laminate does not comprise fibers.

For at least one of opposing front and back surfaces of the laminate, in some embodiments, at least a portion, optionally at least a majority, of the surface is defined by one of the electrically-conductive layer(s). In some embodiments, the one or more electrically-conductive layers comprise two or more electrically-conductive layers, wherein, optionally, at least a portion of the front surface of the laminate is defined by a first one of the electrically-conductive layers and at least a portion of the back surface of the laminate is defined by a second one of the electrically-conductive layers. The electrically-insulative layer(s), in some embodiments, comprise two or more, optionally four or more, electrically-insulative layers. In some embodiments, none of the electrically-conductive layers is disposed between adjacent ones of the electrically-insulative layers. The laminate, in some embodiments, has a thickness that is between 5 mils and 100 mils, between 5 mils and 75 mils, between 5 mils and 50 mils, or between 5 mils and 30 mils.

Some of the present circuit boards comprise some of the present laminates and, for at least one of the front and back surfaces, a solder mask layer bonded to the surface such that the solder mask layer covers at least a majority of the surface. The solder mask layer, in some embodiments, comprises at least 90% by weight of polymer and/or has a thickness that is less than or equal to 3.2 mils, less than or equal to 1.6 mils, or less than or equal to 0.8 mils. Some of the present apparatuses comprise some of the present circuit boards and, optionally, an antenna electrically coupled to the circuit board. In some embodiments, the apparatus is an electrical amplifier, a radar system, or a communication system.

Also disclosed is a method of making a layer of polymeric aerogel suitable for use in at least some of the present laminates. The method can include: (a) providing a monomer or a combination of monomers to a solvent to form a solution; (b) polymerizing the monomer(s) in the solution to form a polymer gel matrix; and (c) subjecting the polymer gel matrix to conditions sufficient to remove liquid from the polymer gel matrix to form an aerogel having a polymeric matrix comprising an open-cell structure. Step (b) can further comprise adding a curing agent to the solution to reduce the solubility of polymers formed in the solution and to form macropores in the gel matrix, the formed macropores containing liquid from the solution. The process can include casting the polymer gel matrix in step (b) onto a support such that a layer of the polymeric gel matrix is comprised on the support, wherein the aerogel in step (c) is in the form of a film.

The aerogel's pore structure can be controlled, including the quantity and volume of macroporous, mesoporous, and microporous cells, primarily by controlling polymer/solvent dynamics during formation of the polymer gel matrix. As one example, a curing agent can be added to the solution in step (b) to reduce the solubility of polymers formed in the solution and to form macropores in the gel matrix, the formed macropores containing liquid from the solution. Such a curing agent can be, for example, 1,4-diazabicyclo[2.2.2]octane. Adding a curing agent to the solution in step (b) to instead improve the solubility of polymers formed in the solution, such as triethylamine, will form a relatively lower number of macropores in the gel matrix. In another example, when forming a polyimide aerogel, increasing the ratio of rigid amines (e.g., p-phenylenediamine (p-PDA)) to more flexible diamines (e.g., 4,4'-oxydianiline (4,4'-ODA)) in the polymer backbone can favor the formation of macropores as opposed to smaller mesopores and micropores.

While more specifics about monomers, solvents, and processing conditions are provided below, in general terms, the following can be adjusted to control the aerogel's pore structure: (1) the polymerization solvent; (2) the polymerization temperature; (3) the polymer molecular weight; (4) the molecular weight distribution; (5) the copolymer composition; (6) the amount of branching; (7) the amount of crosslinking; (8) the method of branching; (9) the method of crosslinking; (10) the method used in formation of the gel; (11) the type of catalyst used to form the gel; (12) the chemical composition of the catalyst used to form the gel; (13) the amount of the catalyst used to form the gel; (14) the temperature of gel formation; (15) the type of gas flowing over the material during gel formation; (16) the rate of gas flowing over the material during gel formation; (17) the pressure of the atmosphere during gel formation; (18) the removal of dissolved gasses during gel formation; (19) the presence of solid additives in the resin during gel formation; (20) the amount of time of the gel formation process; (21) the substrate used for gel formation; (22) the type of solvent or solvents used in each step of the optional solvent exchange process; (23) the composition of solvent or solvents used in each step of the optional solvent exchange process; (24) the amount of time used in each step of the optional solvent exchange process; (25) the dwell time of the part in each step of the solvent exchange process; (26) the rate of flow of the optional solvent exchange solvent; (27) the type of flow of the optional solvent exchange solvent; (28) the agitation rate of the optional solvent exchange solvent; (29) the temperature used in each step of the optional solvent exchange process; (30) the ratio of the volume of optional solvent exchange solvent to the volume of the part; (31) the method of drying; (32) the temperature of each step in the drying process; (33) the pressure in each step of the drying process; (34) the composition of the gas used in each step of the drying process; (35) the rate of gas flow during each step of the drying process; (36) the temperature of the gas during each step of the drying process; (37) the temperature of the part during each step of the drying process; (38) the presence of an enclosure around the part during each step of the drying process; (39) the type of enclosure surrounding the part during drying; and/or (40) the solvents used in each step of the drying process.

The term "aerogel" refers to a class of materials that are generally produced by forming a gel, removing a mobile interstitial solvent phase from the pores, and then replacing it with a gas or gas-like material. By controlling the gel and evaporation system, density, shrinkage, and pore collapse can be minimized. Aerogels of the present invention can include macropores, mesopores, and/or micropores. In preferred aspects, the majority (e.g., more than 50%) of the aerogel's pore volume can be made up of macropores. In other alternative aspects, the majority of the aerogel's pore volume can be made up of mesopores and/or micropores such that less than 50% of the aerogel's pore volume is made up of macropores. In some embodiments, the aerogels of the present invention can have low bulk densities (about 0.75 g/cm$^3$ or less, preferably about 0.01 g/cm$^3$ to about 0.5 g/cm$^3$), high surface areas (generally from about 10 m$^2$/g to 1,000 m$^2$/g and higher, preferably about 50 m$^2$/g to about 1000 m$^2$/g), high porosities (about 20% and greater, preferably greater than about 85%), and/or relatively large pore volumes (more than about 0.3 mL/g, preferably about 1.2 mL/g and higher).

The presence of macropores, mesopores, and/or micropores in the aerogels of the present invention can be determined by mercury intrusion porosimetry (MIP) and/or gas physisorption experiments. The MIP test can be used to measure mesopores and macropores (i.e., American Standard Testing Method (ASTM) D4404-10, Standard Test Method for Determination of Pore Volume and Pore Volume Distribution of Soil and Rock by Mercury Intrusion Porosimetry). Gas physisorption experiments can be used to measure micropores (i.e., ASTM D1993-03 (2008) Standard Test Method for Precipitated Silica-Surface Area by Multipoint BET Nitrogen).

A material's "decomposition temperature" is a temperature at which 2%, 5%, or 10% of a sample of the material, when heated in an environment raised to the temperature, decomposes. The decomposition temperature can be measured by placing the sample in a thermogravimetric analyzer (TGA), heating the sample from ambient temperature in the TGA (e.g., at a rate of 10° C./min), and recording the temperature at which the sample's mass is 2%, 5%, or 10% lower than its initial mass as its decomposition temperature.

The term "coupled" is defined as connected, although not necessarily directly, and not necessarily mechanically. Two items that are "coupled" may be unitary with each other or may be connected to one another via one or more intermediate components or elements.

The terms "a" and "an" are defined as one or more unless this disclosure explicitly requires otherwise.

The term "substantially" is defined as largely, but not necessarily wholly, what is specified (and includes what is specified; e.g., substantially 90 degrees includes 90 degrees, and substantially parallel includes parallel), as understood by a person of ordinary skill in the art. In any disclosed embodiment, the terms "substantially," "approximately," and "about" may be substituted with "within [a percentage] of" what is specified, where the percentage is 1, 1, 5, or 10%.

The phrase "and/or" means and or or. To illustrate, A, B, and/or C includes: A alone, B alone, C alone, a combination of A and B, a combination of A and C, a combination of B and C, or a combination of A, B, and C. In other words, "and/or" operates as an inclusive or.

The terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, an apparatus that "comprises," "has," "includes," or "contains" one or more elements possesses those one or more elements, but is not limited to possessing only those one or more elements. Likewise, a method that "comprises," "has," "includes," or "contains" one or more steps possesses those one or more steps, but is not limited to possessing only those one or more steps.

Any embodiment of any of the apparatuses and methods can consist of or consist essentially of—rather than comprise/have/include/contain-any of the described elements, features, and/or steps. Thus, in any of the claims, the phrase "consisting of" or "consisting essentially of" can be substituted for any of the open-ended linking verbs recited above, in order to change the scope of a given claim from what it would otherwise be using the open-ended linking verb.

The feature or features of one embodiment may be applied to other embodiments, even though not described or illustrated, unless expressly prohibited by this disclosure or the nature of the embodiments.

Some details associated with the embodiments described above and others are described below.

BRIEF DESCRIPTION OF THE DRAWINGS

The following drawings illustrate by way of example and not limitation. For the sake of brevity and clarity, every feature of a given structure is not always labeled in every figure in which that structure appears. Identical reference numbers do not necessarily indicate identical structures. Rather, the same reference numbers may be used to indicate similar features or features with similar functionalities, as may non-identical reference numbers.

FIG. 5A omits the circuit board's solder mask layer.

DETAILED DESCRIPTION

Figure 1A:
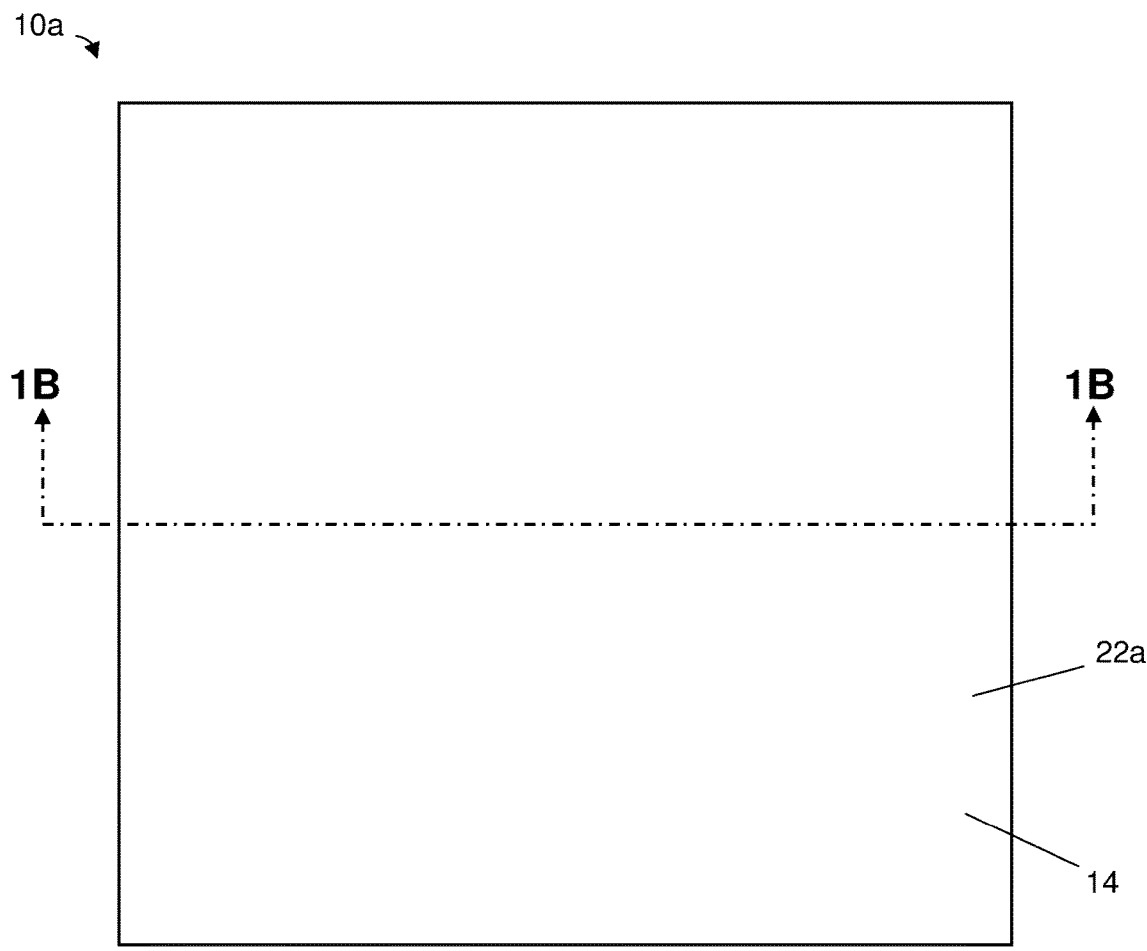
FIG. 1A is a top view of a first embodiment of the present laminates that includes a polymeric aerogel layer disposed between two copper-containing layers.
Figure 1B:
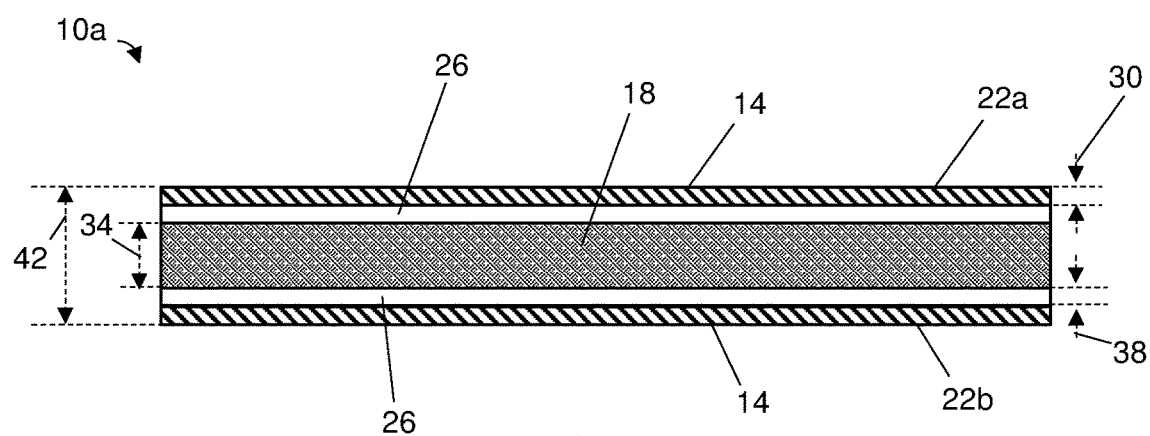
FIG. 1B is a cross-sectional view of the laminate of FIG. 1A taken along line 1B-1B.
Figure 2A:
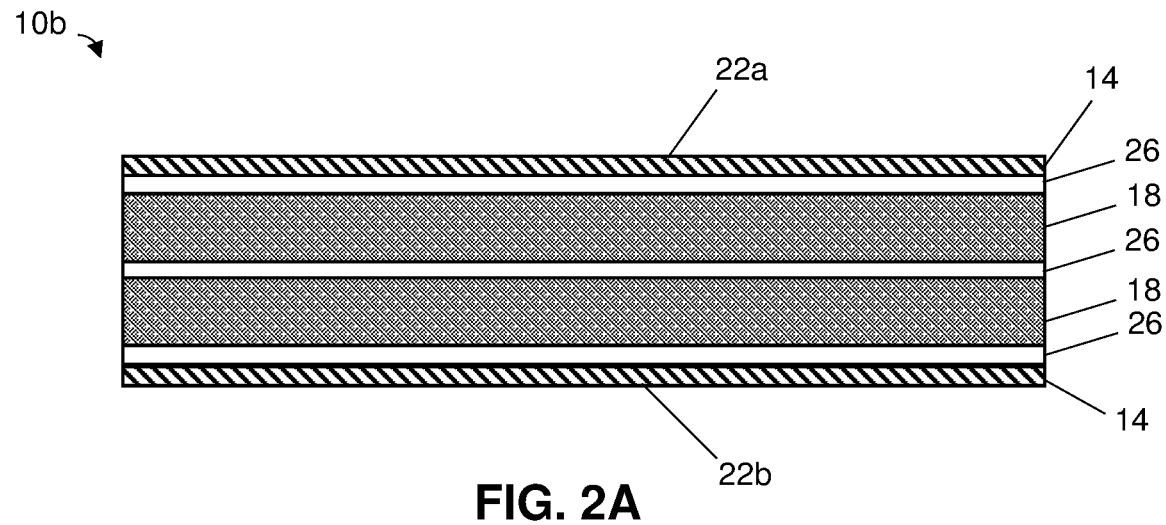
FIG. 2A is a cross-sectional view of a second embodiment of the present laminates that includes two polymeric aerogel layers disposed between two copper-containing layers.
Figure 2B:
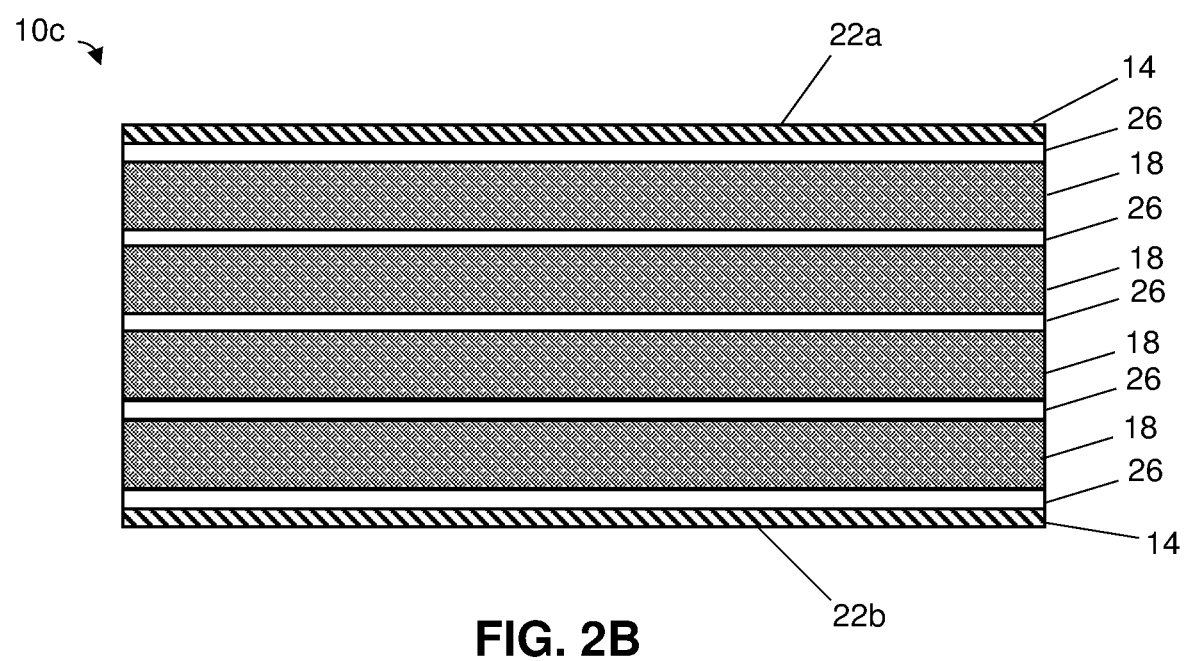
FIG. 2B is a cross-sectional view of a third embodiment of the present laminates that includes four polymeric aerogel layers disposed between two copper-containing layers.

A. Copper-Clad Laminates, Circuit Boards, and Apparatuses Incorporating the Same Referring to FIGS. 1A and 1B, shown is a first embodiment 10a of the present laminates. Laminate 10a can include one or more electrically-conductive layers 14 and one or more electrically-insulative layers 18, such as greater than or equal to any one of, or between any two of, 1, 2, 3, 4, 5, or 6 electrically-conductive layers and greater than or equal to any one of, or between any two of, 1, 2, 3, 4, 5, or 6 electrically-insulative layers. As shown, laminate 10a includes two electrically-conductive layers 14 and a single electrically-insulative layer 18 disposed there between. In other embodiments, however, a laminate (e.g., 10b or 10c) can include multiple electrically-insulative layers 18, such as two (FIG. 2A) or four (FIG. 2B) electrically-insulative layers.

For at least one (e.g., each) of opposing front and rear surfaces 22a and 22b of a laminate (e.g., 10a-10c), at least a portion (e.g., at least a majority, up to including all) of the surface (e.g., the surface's planform area) can be defined by one of electrically-conductive layer(s) 14; as shown, substantially all of the front and rear surfaces are defined by first and second ones, respectively, of the electrically-conductive layers, with all of electrically-insulative layer(s) 18 disposed between the first and second electrically-conductive layers. In this manner, one or more of electrically-conductive layer(s) 14 can be exposed such that a circuit can be manufactured therefrom (e.g., via etching, described below), with electrically-insulative layer(s) 18 supporting the conducting layer(s) and insulating them. To further facilitate such circuit manufacturing, in some embodiments in which there are multiple electrically-insulative layers 18, none of the electrically-conductive layer(s) 14 is disposed between adjacent ones of the electrically-insulative layers.

Each of electrically-conductive layer(s) 14 can comprise copper, which can facilitate electric conductivity. For example, each of electrically-conductive layer(s) 14 can comprise greater than or equal to any one of, or between any two of, 90%, 91%, 92%, 93%, 94%, 95%, 96%, 97%, 98%, or 99%, by weight, of copper. A thickness 30 of each of electrically-conductive layer(s) 14 can promote manufacturability and suitable electric properties. For example, at least one (e.g., each) of electrically-conductive layer(s) 14 can have a thickness 30 that is less than or equal to any one of, or between any two of, 4.5, 4.0, 3.5, 3.0, 2.5, 2.0, 1.5, 1.0, 0.9, 0.8, 0.7, 0.6, or 0.5 mils (e.g., between 0.5 and 3.0 mils, such as between 0.5 and 2 mils, such as between 0.5 and 0.9 mils, approximately 1.4 mils, or approximately 0.7 mils). An area density of each of electrically-conductive layer(s) 14 can be less than or equal to any one of, or between any two of, 3.0, 2.5, 2.0, 1.5, 1.0, 0.75, 0.50, or 0.25 ounces per square foot (0.5 oz/ft$^2$) (e.g., between 0.35 and 3.0 oz/ft$^2$, such as between 0.35 and 0.75 oz/ft$^2$ or approximately 0.5 oz/ft$^2$). Electrically-conductive layer(s) 14 with a relatively high thickness (e.g., greater than or equal to 1.5 mils and/or an area density that is greater than or equal to 1.1 oz/ft$^2$) can be used to accommodate larger power loads.

In some aspects, each of the electrically-insulative layer(s) 18 can contain a porous material. In certain aspects, the porous material can be an open celled porous material. In certain other aspects, the porous material can be a closed celled porous material. In certain aspects, the porous material can be a foam. In certain aspects, the foam can be an organic or silicone foam. Non-limiting examples of the organic foam can include polyurethane, polystyrene, polyvinyl chloride, (meth)acrylic polymer, polyamide, polyimide, polyaramide, polyurea, polyester, polyolefin (such as polyethylene, polypropylene, ethylene propylene diene monomer (EPDM) foam, or the like), polyethylene terephthalate, polybutylene terephthalate, polyvinyl chloride, polyvinyl acetate, ethyl vinyl alcohol (EVOH), ethylene-vinyl acetate (EVA), polymethyl methacrylates, polyacrylates, polycarbonates, polysulphonates, or synthetic rubber foam, or any combinations thereof. In certain aspects, the foam can be a polyurethane foam. In certain aspects, the porous material can be an aerogel. In some aspects, each of the electrically-insulative layer(s) 18 can comprise a layer of polymeric aerogel. To facilitate desirable dielectric properties (e.g., a low dielectric constant and a low dissipation factor), each aerogel layer 18 can be relatively thin. For example, a thickness 34 of at least one (e.g., each) of aerogel layer(s) 18 can be less than or equal to any one of, or between any two of, 20, 19, 18, 17, 16, 15, 14, 13, 12, 11, 10, 9.0, 8.0, 7.0, 6.0, 5.0, 4.0, or 3.0 mils, preferably less than or equal to 12 mils (e.g., approximately 10 mils) or less than or equal to 7.0 mils (e.g., approximately 5.0 mils). In some embodiments, each of the electrically-insulative layer(s) 18 has i) a dielectric constant any one of, at most any one of, or between any two of 3, 2.75, 2.5, 2.25, 2, 1.75, 1.6, 1.4, 1.3, 1.2 and 1.1 at 10 GHz; and/or a dissipation factor any one of, at most any one of, or between any two of 0.005, 0.004, 0.003, 0.0025, 0.00225, 0.002, 0.00175, 0.0015, 0.00125, 0.001, 0.00075, and 0.0005 at 10 GHz.

Each polymeric aerogel layer 18 can have micropores, mesopores, and/or macropores. Greater than or equal to any one of, or between any 10%, 25%, 50%, 75%, or 95% of a pore volume of each aerogel layer 18 can be made up of micropores, mesopores, and/or macropores (e.g., of micropores, of mesopores, of micropores and mesopores, or of macropores). An average pore volume of each aerogel layer 18 can be greater than or equal to any one of, or between any two of, 50, 100, 150, 200, 250, 300, 350, 400, 450, 500, 800, 1,000, 2,000, 3,000, 4,000, or 5,000 nm.

Each of aerogel layer(s) 18 can also be heat-resistant such that the laminate can withstand heating during circuit board manufacturing (e.g., during soldering) and when the laminate is in used (e.g., from heat generated from electricity flowing through the laminate). For example, a decomposition temperature of at least one (e.g., each) of aerogel layer(s) 18 can be greater than or equal to any one of, or between any two of, 400, 425, 450, 475, 500, 525, 550, 575, or 600° C. (e.g., greater than or equal to 450° C.). Materials of and processes for making layers of polymeric aerogels are explained in Sections B and C below.

In some aspects, each of the electrically-insulative layer(s) 18 can contain fibers without a porous material of the present invention. In other aspects, each of the electrically-insulative layer(s) 18 can contain a combination of fibers with a porous material of the present invention (e.g., fibers dispersed or aligned within a porous material). The fibers can be natural, synthetic, semi-synthetic fibers, or combinations thereof. The fibers can comprise vegetable, wood, animal, mineral, biological fibers, or combinations thereof. In some particular instances, the fibers can comprise rayon, bamboo, diacetate, triacetate fibers, polyester fibers, aramid fibers, or combinations thereof. In some embodiments, the fibers comprise metal fibers, carbon fibers, carbide fibers, glass fibers, mineral fibers, basalt fibers, or combinations thereof. In some embodiments, the fibers comprise thermoplastic polymer fibers, thermoset polymer fibers, or combinations thereof. Non-limiting examples of thermoplastic fibers includes fibers of polyethylene terephthalate (PET), a polycarbonate (PC) family of polymers, polybutylene terephthalate (PBT), poly(1,4-cyclohexylidene cyclohexane-1,4-dicarboxylate) (PCCD), glycol modified polycyclohexyl terephthalate (PCTG), poly(phenylene oxide) (PPO), polypropylene (PP), polyethylene (PE), polyvinyl chloride (PVC), polystyrene (PS), polymethyl methacrylate (PMMA), polyethyleneimine or polyetherimide (PEI) and their derivatives, thermoplastic elastomer (TPE), terephthalic acid (TPA) elastomers, poly(cyclohexanedimethylene terephthalate) (PCT), polyethylene naphthalate (PEN), polyamide (PA), polysulfone sulfonate (PSS), sulfonates of polysulfones, polyether ether ketone (PEEK), polyether ketone ketone (PEKK), acrylonitrile butyldiene styrene (ABS), polyphenylene sulfide (PPS), co-polymers thereof, or blends thereof. Non-limiting examples of thermoset fibers include a fiber of unsaturated polyester resins, polyurethanes, polyoxybenzylmethylenglycolanhydride (e.g., bakelite), urea-formaldehyde, diallyl-phthalate, epoxy resin, epoxy vinylesters, polyimides, cyanate esters of polycyanurates, dicyclopentadiene, phenolics, benzoxazines, co-polymers thereof, or blends thereof. In some embodiments, the fibers are polyaramid, polyimide, polybenzoxazole, polyurethane, or blends thereof. In some embodiments, the fibers are vinylon. In some embodiments, the fibers are polyester fibers. In some embodiments, the fibers are non-woven. In some embodiments, the fibers form a fiber matrix. In some embodiments, the fibers have an average filament cross sectional area of 5 $\mu m^2$ to 40,000 $\mu m^2$ and an average length of 20 mm to 100 mm. In some embodiments, the cross sectional area is 5, 10, 15, 20, 25, 50, 100, 150, 200, 250, 300, 350, 400, 450, or 500 $\mu m^2$ or between any two of those values. In some embodiments, the fibers have an average length of approximately 0.1, 0.2, 0.3, 0.4, 0.5, 1, 2, 3, 4, 5, 6, 7, 8, 9, 10, 20, 30, 40, 50, 60, 70, 80, 90, 100, 150, 200, 250, 300, 350, 400, 450, 500, 600, 700, 800, 900, 1000, 1500, 2000, 3000, 4000, 5000 mm or between any two of those values. Bundles of various kinds of fibers can be used depending on the use intended for the internally reinforced aerogel. For example, the bundles may be of carbon fibers or ceramic fibers, or of fibers that are precursors of carbon or ceramic, glass fibers, aramid fibers, or a mixture of different kinds of fiber. Bundles can include any number of fibers. For example, a bundle can include 400, 750, 800, 1375, 1000, 1500, 3000, 6000, 12000, 24000, 50000, or 60000 filaments. The fibers can have a filament diameter of 5 to 24 microns, 10 to 20 microns, or 12 to 15 microns or any range there between, or 5, 6, 7, 8, 9, 10, 11, 12, 13, 14, 15, 16, 17, 18, 19, 20, 21, 22, 23, 24 microns or any value there between. The fibers in a bundle of fibers can have an average filament cross sectional area of 7 $\mu m^2$ to 800 $\mu m^2$, which equates to an average diameter of 3 to 30 microns for circular fibers. In some embodiments, the fiber matrix comprises felt, batting, non-woven fabric, or a mat.

The laminate can also comprise one or more adhesive layers 26, such as greater than or equal to any one of, or between any two of, 1, 2, 3, 4, 5, 6, 7, 8, 9, or 10 adhesive layers, to bond other layers of the laminate together. Each of adhesive layer(s) 26 can be disposed between adjacent ones of the other laminate layers (e.g., electrically-conductive layer(s) 14 and electrically-insulative layer(s) 18). Bonding can be achieved by stacking the layers (e.g., 14, 18, 26) and applying heat and/or pressure to the stack (e.g., with a press), optionally such that the temperature thereof exceeds the glass transition temperature of adhesive layer(s) 26.

Adhesive layer(s) 26 can have a composition that mitigates the risk of delamination, such as through heat resistance. For example, at least one (e.g., each) of adhesive layer(s) 26 can have a decomposition temperature that is greater than or equal to any one of, or between any two of, 350, 375, 400, 425, 450, or 500° C. Additionally, at least one (e.g., each) of adhesive layer(s) 26 can have a glass transition temperature or a melting point that is greater than or equal to any one of, or between any two of, 100, 150, 175, 200, 225, 250, or 275° C. Adhesive layer(s) 26 can also promote a low dielectric constant and dissipation factor for the laminate. For example, measured at 10 GHz, at least one (e.g., each) of adhesive layer(s) 26 can have a dielectric constant that is less than or equal to any one of, or between any two of, 3.5, 3.25, 3.0, 2.75, 2.5, or 2.25 (e.g., less than or equal to 3.0) and/or a dissipation factor that is less than or equal to any one of, or between any two of, 0.0040, 0.0035, 0.0030, 0.0025, 0.0020, or 0.0015 (e.g., less than or equal to 0.00375). Illustrative adhesives suitable for adhesive layer(s) 26 include fluoropolymer films, polyimide films, and B-stage epoxies. Adhesives for adhesive layer(s) 26 can be commercially-available adhesives, such as FEP Film, Pyralux® HT, and Pyralux® GPL from DuPont™ and TSU510S-A from Toyochem Co., LTD. (Tokyo, Japan), Teflon FEP from Dupont™. A thickness 38 of at least one (e.g., each) of adhesive layer(s) 26 can be less than or equal to any one of, or between any two of, 5.0, 4.0, 3.0, 2.0, 1.25, 1.0, 0.75, 0.60, 0.50, 0.40, or 0.30 mils (e.g., between 0.3 and 0.7 mils, such as approximately 0.5 mils), which can facilitate adhesion while promoting desirable dielectric properties.

The laminate can have a total thickness 42 (e.g., measured between front and rear surfaces 22a and 22b) suitable for use in circuit boards and that is relatively thin (e.g., to promote a low dielectric constant and dissipation factor). For example, thickness 42 can be less than or equal to any one of, or between any two of, 100, 75, 50, 40, 30, or 20 mils (e.g., between 5 and 30 mils).

The laminate can have dielectric properties suitable for use in high-frequency applications (e.g., with signal frequencies at 10-300 GHz). For example, the laminate can have an ultra-low dielectric constant, such as one that at 10 GHz is less than or equal to any one of, or between any two of, 2.0, 1.9, 1.8, 1.7, or 1.6 (e.g., less than or equal to 1.75), such that electric signals can be propagated through the laminate a relatively high speed. Additionally, the laminate can have a low dissipation factor to mitigate dielectric losses, such as one that at 10 GHz is less than or equal to any one of, or between any two of, 0.0025, 0.00225, 0.002, 0.00175, or 0.0015 (e.g., less than or equal to 0.002).

Figure 3A:
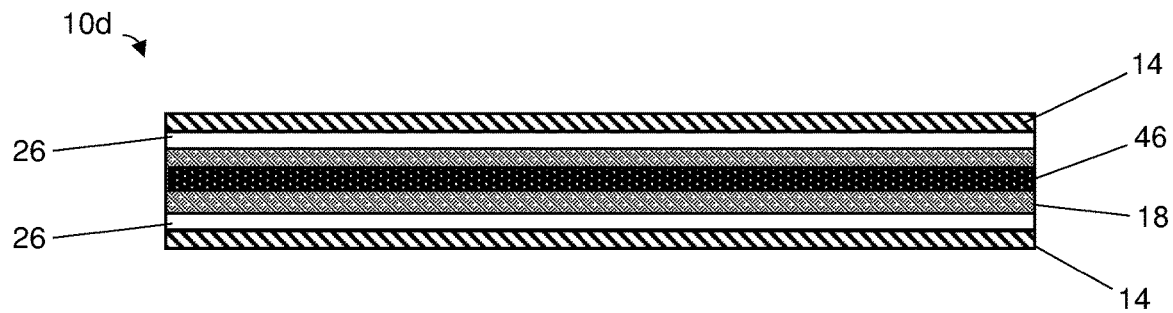
FIG. 3A is a cross-sectional view of a fourth embodiment of the present laminates that includes a reinforcing layer embedded in a polymeric aerogel layer.
Figure 3B:
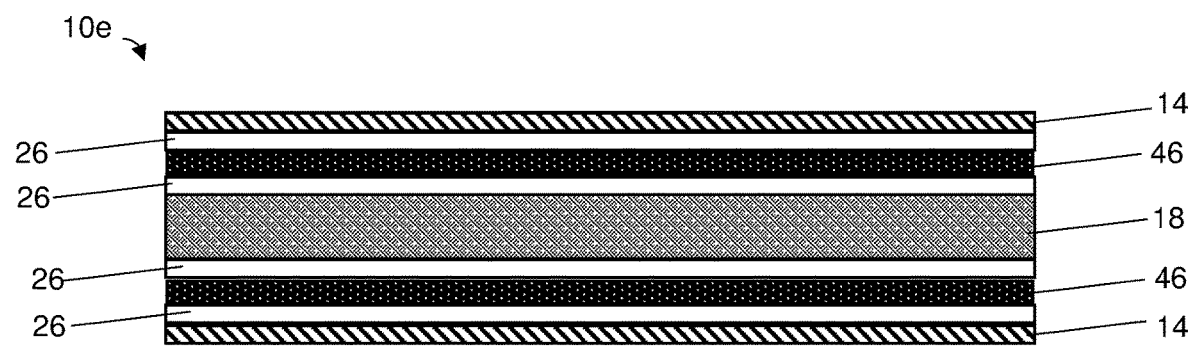
FIG. 3B is a cross-sectional view of a fifth embodiment of the present laminates that includes non-embedded reinforcing layers in addition to the polymeric aerogel and copper-containing layers.

In some embodiments, the laminate can include reinforcements to promote strength and/or rigidity (e.g., for rigid circuit board applications), such as a plurality of fibers. For example, referring to FIGS. 3A and 3B, shown are laminates 10d and 10e that are substantially the same as laminate 10a, except that they each include one or more reinforcing layers 46, such as greater than or equal to any one of, or between any two of, 1, 2, 3, 4, 5, 6, 7, or 8 reinforcing layers. At least one (e.g., each) of reinforcing layer(s) 46 can include one or more sheets. At least one (e.g., each) of the sheet(s) can be a unidirectional, woven, and/or nonwoven sheet comprising fibers that, optionally, are dispersed in a thermoplastic or thermoset resin (e.g., a resin that is distinct in structure (e.g., non-porous) or composition from aerogel layer(s) 18). A sheet of a reinforcing layer 46 can also be substantially free of fibers (e.g., a polymeric film, such as a fluoropolymer film). When including multiple sheets, a reinforcing layer 46 can be a consolidated laminate. Additionally or alternatively, at least one (e.g., each) of reinforcing layer(s) 46 can comprise a paper sheet that, optionally, comprises cellulose fibers, vinylon fibers, polyester fibers, polyolefin fibers, and/or polypropylene fibers. Suitable paper for reinforcing layer(s) 46 is commercially available from Hirose Paper Mfg. Co. (Kochi, Japan) or Hirose Paper North America (Macon, Georgia, USA).

As shown, for at least one of aerogel layer(s) 18, at least one of reinforcing layer(s) 46 is embedded in the aerogel layer (FIG. 3A). While as shown a single reinforcing layer 46 is embedded in aerogel layer 18, in other embodiments multiple reinforcing layers (e.g., greater than or equal to any one of, or between an two of, 2, 3, 4, 5, or 6 reinforcing layers) can be embedded in an aerogel layer. Additionally or alternatively, one or more reinforcing layer(s) 46 need not be embedded in one of aerogel layer(s) 18 and can be adhered to other laminate layers via one or more of adhesive layer(s) 26 (e.g., can be disposed between adjacent ones of the adhesive layer(s)). A reinforcing or support layer 46 can be embedded in or attached to an aerogel layer 18 as described in Section C.

Furthermore, while as shown laminates 10d and 10e are reinforced with reinforcing layer(s) 46, in some embodiments at least one (e.g., each) of aerogel layer(s) 18 can include reinforcing fibers that are dispersed throughout the aerogel layer (e.g., are chopped or discontinuous fibers not arranged in a sheet), optionally such that the volume of the fibers is greater than or equal to any one of, or between any two of, 0.1%, 10%, 20%, 30%, 40%, or 50% of the aerogel layer's volume. In some embodiments, however, the laminate does not comprise fibers (e.g., to promote flexibility).

Suitable fibers include glass fibers, carbon fibers, aramid fibers, thermoplastic fibers, thermoset fibers, ceramic fibers, basalt fibers, rock wool fibers, steel fibers, cellulosic fibers, and/or the like. An average filament cross-sectional area of the fibers used for reinforcement can be greater than or equal to any one of, or between any two of, 7, 15, 30, 60, 100, 200, 300, 400, 500, 600, 700, or 800 $\mu m^2$; for example, for fibers with a circular cross-section, an average diameter of the fibers can be greater than or equal to any one of, or between any two of, 3, 4, 5, 6, 7, 8, 9, 10, 11, 12, 13, 14, 15, 16, 17, 18, 19, 20, 21, 22, 23, 24, 25, 26, 27, 28, 29, or 30 $\mu m$ (e.g., between 5 and 24 $\mu m$, such as between 10 and 20 $\mu m$ or between 12 and 15 $\mu m$).

Non-limiting examples of thermoplastic polymers that can be used as a material in which fibers are dispersed in a reinforcing layer 46 and/or for polymeric reinforcing fibers include polyethylene terephthalate (PET), polycarbonate (PC), polybutylene terephthalate (PBT), poly(1,4-cyclohexylidene cyclohexane-1,4-dicarboxylate) (PCCD), glycol modified polycyclohexyl terephthalate (PCTG), poly(phenylene oxide) (PPO), polypropylene (PP), polyethylene (PE), polyvinyl chloride (PVC), polystyrene (PS), polymethyl methacrylate (PMMA), polyethyleneimine or polyetherimide (PEI) and their derivatives, thermoplastic elastomer (TPE), terephthalic acid (TPA) elastomers, poly(cyclohexanedimethylene terephthalate) (PCT), polyethylene naphthalate (PEN), polyamide (PA), polysulfone sulfonate (PSS), sulfonates of polysulfones, polyether ether ketone (PEEK), polyether ketone (PEKK), acrylonitrile butyldiene styrene (ABS), polyphenylene sulfide (PPS), co-polymers thereof, polyesters or derivatives thereof, polyamides or derivatives thereof (e.g., nylon), or blends thereof.

Non-limiting examples of thermoplastic polymers that can be used as a material in which fibers are dispersed in a reinforcing layer 46 and/or for polymeric reinforcing fibers include unsaturated polyester resins, polyurethanes, polyoxybenzylmethylenglycolanhydride (e.g., Bakelite), urea-formaldehyde, diallyl-phthalate, epoxy resin, epoxy vinylesters, polyimides, cyanate esters of polycyanurates, dicyclopentadiene, phenolics, benzoxazines, co-polymers thereof, or blends thereof.

Such reinforcements can promote laminate strength and rigidity. For example, each of electrically-insulative layer(s) 18 in which the aerogel layer is reinforced (e.g., with one or more embedded sheets and/or fiber reinforcements dispersed throughout the aerogel) can have a tensile strength that is greater than or equal to any one of, or between any two of, 5, 10, 15, 20, or 25 MPa and/or a Young's modulus that is greater than or equal to any one of, or between any two of, 200, 225, 250, 275, 300, 325, or 350 MPa. Each of reinforcing layer(s) 46 can also be more rigid than other laminate layers; for example, a flexural rigidity of each of the reinforcing layer(s) can be greater than or equal to any one of, or between any two of, 10%, 20%, 30%, or 40% larger than a flexural rigidity of each of electrically-conductive layer(s) 14 and electrically-insulative layer(s) 18.

A further description of suitable reinforcements for aerogel layer(s) 18 is described in U.S. Pat. No. 10,500,557 to Sakaguchi et al., which is incorporated herein by reference in its entirety.

Figure 4:
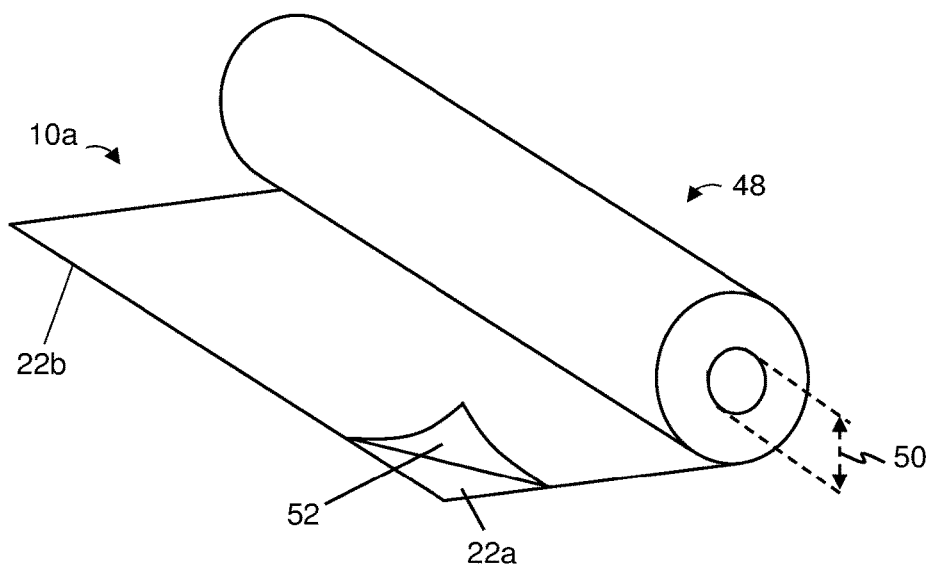
FIG. 4 is a perspective view of a roll of the laminate of FIG. 1A.

A laminate (e.g., 10a-10e) can be rigid or flexible. For example, referring to FIG. 4, the laminate (whether or not reinforced as described above) can be capable of being disposed in a roll 48 having an inner diameter 50 of less than or equal to any one of, or between any two of, 10 cm, 8 cm, 5 cm, 4 cm, 2 cm, or 1 cm without suffering permanent deformation. Such flexibility-even if not rising to the level of this example—can be provided by the materials of the laminate's electrically-conductive, aerogel, and other (if present) layers and/or the relatively small thicknesses of those layers (e.g., those discussed above). When in a roll 48, a portion of the laminate's front surface 22a can face a portion of its back surface 22b. The laminate can have a protective film 52 removably disposed over at least one of its front and back surfaces 22a and 22b (e.g., to protect one or more of electrically-conductive layer(s) 14). Protective film 52 can be removed from the laminate by, for example, peeling it away from the laminate. Such a protective film does not form part of the laminate.

Such a flexible laminate may be suitable for use in flexible circuit boards. However, in other embodiments, the laminate can have a higher rigidity (e.g., such that it is not capable of being disposed in such a roll without suffering permanent deformation and/or breaking), which can be provided by the above-described reinforcements. Such laminates may be suitable for use in rigid circuit boards.

Figure 5A:
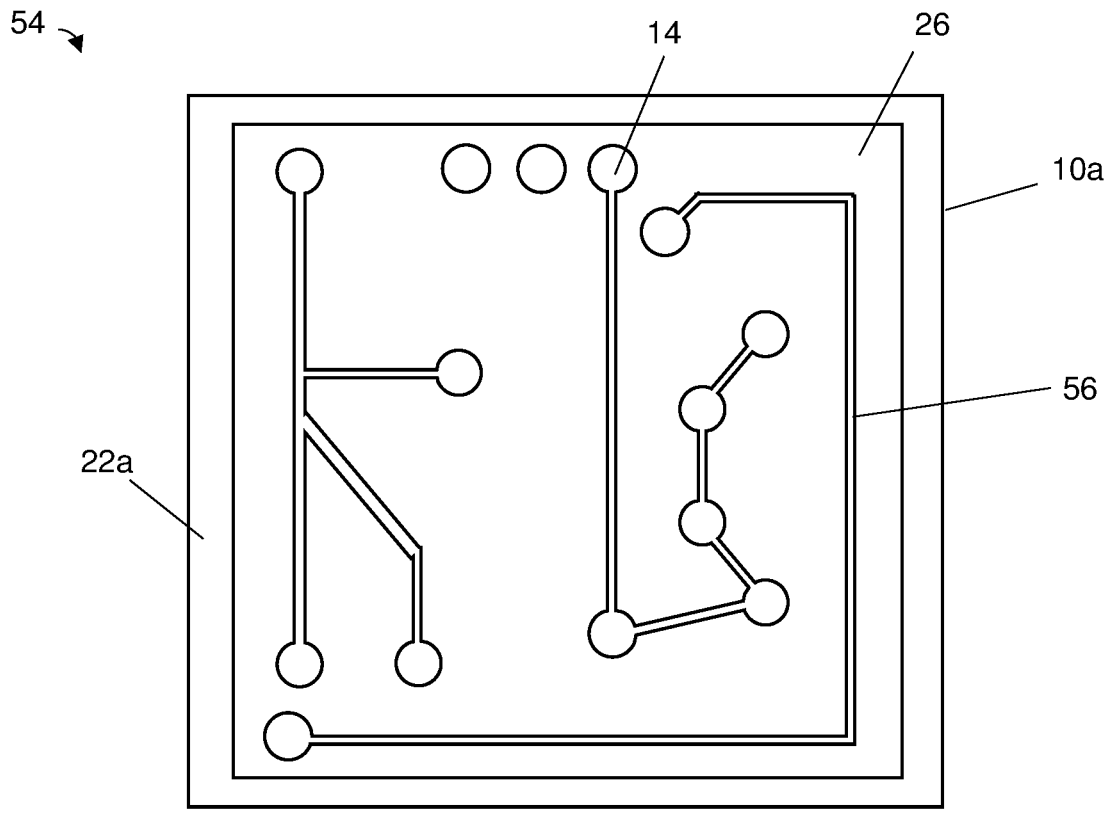
FIG. 5A is a top view of one of the present circuit boards that comprises the laminate of FIG. 1A, with the laminate's top copper-containing layer etched to define separate conducting paths.
Figure 5B:
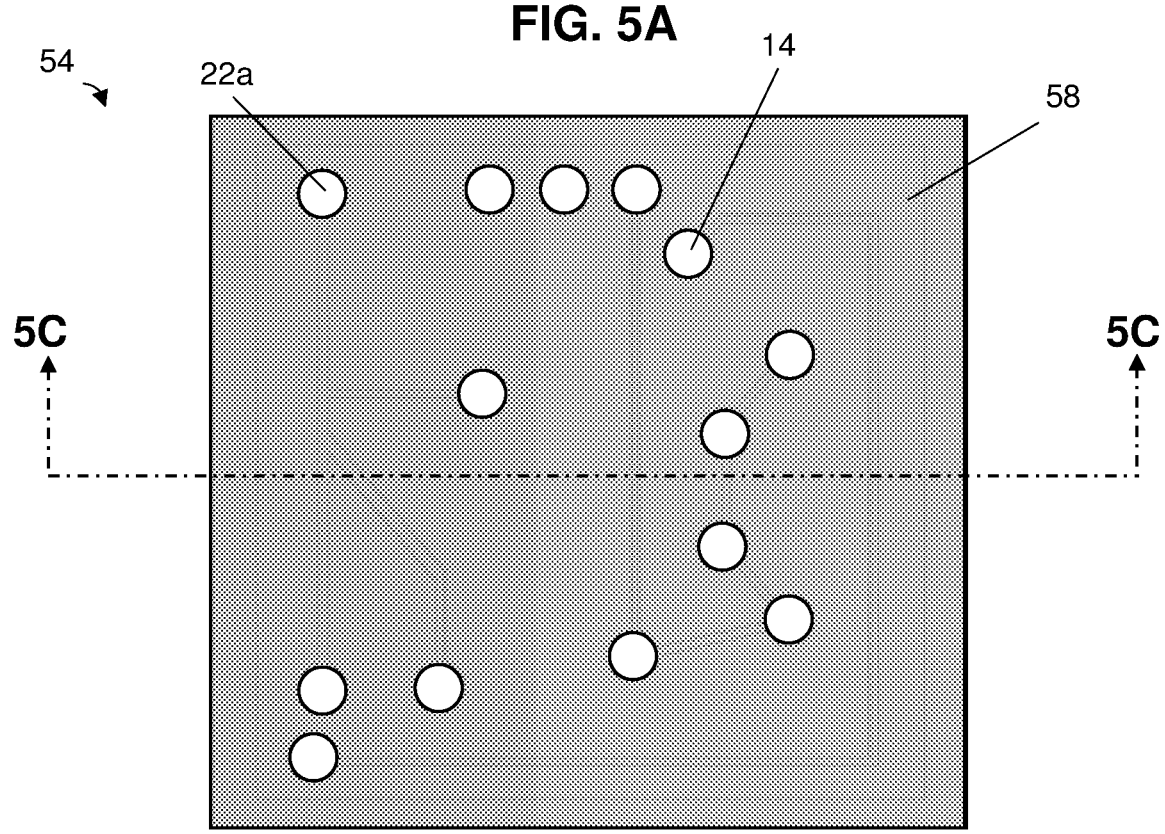
FIG. 5B is a top view of the circuit board of FIG. 5A with a solder mask layer covering at least a majority of the laminate's upper surface.
Figure 5C:
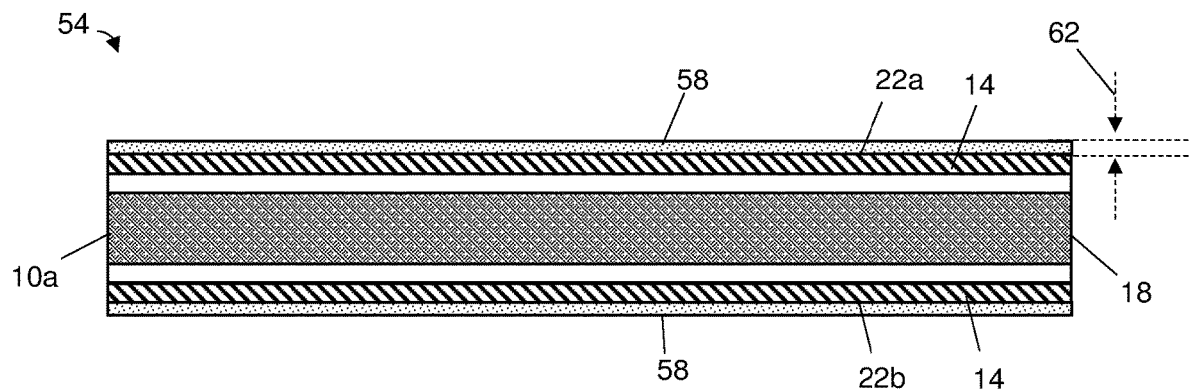
FIG. 5C is a cross-sectional view of the circuit board of FIG. 5A taken along line 5C-5C of FIG. 5B.

Some of the present laminates (e.g., 10a-10e) can be incorporated in a circuit board. For example, referring to FIGS. 5A-5C, shown is a circuit board 54 that comprises laminate 10a. As shown, at least one (e.g., each) of electrically-conductive layer(s) 14 that defines at least a portion of one of front and back surfaces 22a and 22b can be etched such that the conductive layer defines one or more conductive lines 56. Etching can remove material from an electrically-conductive layer 14; as a result, the etched layer(s) can define smaller surface area(s) of front and/or rear surfaces 22a and 22b than (e.g., less than or equal to any one of, or between any two of, 90%, 80%, 70%, 60%, 50%, or 40% of) that defined by each of polymeric aerogel layer(s) 18 and/or adhesive layer(s) 26 (e.g., where such surface areas are measured as planform areas).

Circuit board 54 can include one or more solder mask layers 58, each bonded to respective one of front and back surfaces 22a and 22b such that the solder mask layer covers at least a majority of the surface (FIGS. 5B and 5C). Each of solder mask layer(s) 58 can protect outermost electrically-conductive layer(s) 14 (e.g., from corrosion, damage, and/or short-circuits). For example, each solder mask layer 58 can comprise a polymer (e.g., any of those described above), optionally such that the solder mask layer comprises greater than or equal to any one of, or between any two of, 90%, 91%, 92%, 93%, 94%, 95%, 96%, 97%, 98%, or 99% of the polymer. To promote such protection while maintaining suitable manufacturability and/or electrical properties, a thickness 62 of each of solder mask layer(s) 58 can be less than or equal to any one of, or between any two of, 3.2, 3.0, 2.8, 2.6, 2.4, 2.2, 2.0, 1.8, 1.6, 1.4, 1.2, 1.0, or 0.8 mils (e.g., between 0.8 and 3.2 mils). Each of solder mask layer(s) 58 can cover less than all of the surface (e.g., 22a or 22b) to which the solder mask layer is bonded such that at least a portion of the electrically-conductive layer 14 is exposed (e.g., such that components can be electrically connected thereto) (FIG. 5B).

Figure 6:
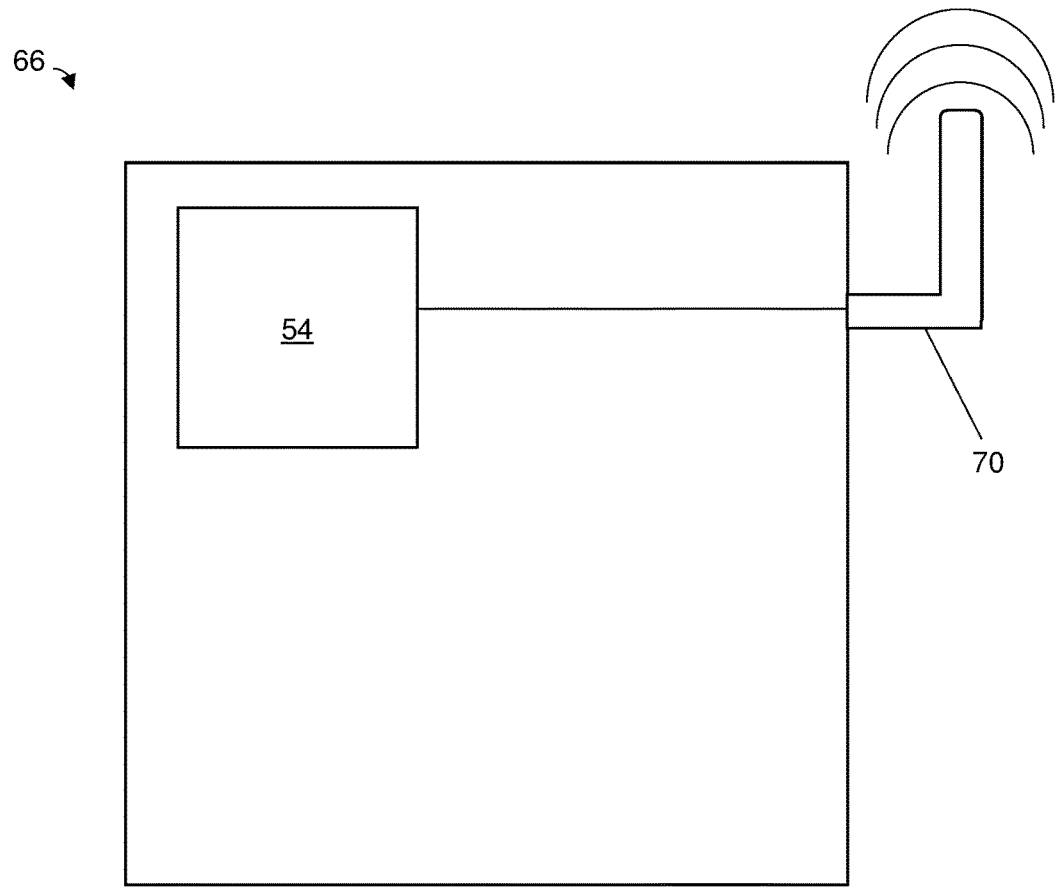
FIG. 6 is a schematic of one of the present apparatuses that includes the circuit board of FIG. 5A electrically coupled to an antenna.

Some of the present circuit boards (e.g., 54) can be incorporated in an apparatus (e.g., 66) used for high-frequency (e.g., 10-300 GHz) applications. For example, referring to FIG. 6, shown is an apparatus 66 that comprises circuit board 54 and an antenna 70 that is electrically coupled to the circuit board. As shown, apparatus 66 is a communication system (e.g., used in a satellite, high-speed router and server, a spacecraft, cellular phone, cellular tower, and/or the like). Apparatus 66 can also be another apparatus used in high-frequency applications, such as an electrical amplifier and/or a radar system.

B. Materials of Layers of Polymeric Aerogel

A layer of polymeric aerogel can include organic materials, inorganic materials, or a mixture thereof. Organic aerogels can be made from polyacrylates, polystyrenes, polyacrylonitriles, polyurethanes, polyurea, polyimides, polyamides, polyaramids, polyfurfural alcohol, phenol furfuryl alcohol, melamine formaldehydes, resorcinol formaldehydes, cresol formaldehyde, phenol formaldehyde, polyvinyl alcohol dialdehyde, polycyanurates, polyacrylamides, various epoxies, agar, agarose, and the like. In particular embodiments the aerogel is a polyimide aerogel.

Polyimides are a type of polymer with many desirable properties. Polyimide polymers include a nitrogen atom in the polymer backbone, where the nitrogen atom is connected to two carbonyl carbons, such that the nitrogen atom is somewhat stabilized by the adjacent carbonyl groups. A carbonyl group includes a carbon, referred to as a carbonyl carbon, which is double bonded to an oxygen atom. Polyimides are usually considered an AA-BB type polymer because usually two different classes of monomers are used to produce the polyimide polymer. Polyimides can also be prepared from AB type monomers. For example, an aminodicarboxylic acid monomer can be polymerized to form an AB type polyimide. Monoamines and/or mono anhydrides can be used as end capping agents if desired.

One class of polyimide monomer is usually a diamine, or a diamine monomer. The diamine monomer can also be a diisocyanate, and it is to be understood that an isocyanate could be substituted for an amine in this description, as appropriate. There are other types of monomers that can be used in place of the diamine monomer, as known to those skilled in the art. The other type of monomer is called an acid monomer, and is usually in the form of a dianhydride. In this description, the term "di-acid monomer" is defined to include a dianhydride, a tetraester, a diester acid, a tetracarboxylic acid, or a trimethylsilyl ester, all of which can react with a diamine to produce a polyimide polymer. Dianhydrides are to be understood as tetraesters, diester acids, tetracarboxylic acids, or trimethylsilyl esters that can be substituted, as appropriate. There are also other types of monomers that can be used in place of the di-acid monomer, as known to those skilled in the art.

Because one di-acid monomer has two anhydride groups, different diamino monomers can react with each anhydride group so the di-acid monomer may become located between two different diamino monomers. The diamine monomer contains two amine functional groups; therefore, after the first amine functional group attaches to one di-acid monomer, the second amine functional group is still available to attach to another di-acid monomer, which then attaches to another diamine monomer, and so on. In this manner, the polymer backbone is formed. The resulting polycondensation reaction forms a polyamic acid.

The polyimide polymer is usually formed from two different types of monomers, and it is possible to mix different varieties of each type of monomer. Therefore, one, two, or more di-acid monomers can be included in the reaction vessel, as well as one, two, or more diamino monomers. The total molar quantity of di-acid monomers is kept about the same as the total molar quantity of diamino monomers if a long polymer chain is desired. Because more than one type of diamine or di-acid can be used, the various monomer constituents of each polymer chain can be varied to produce polyimides with different properties. For example, a single diamine monomer AA can be reacted with two di-acid co monomers, $B_1B_1$ and $B_2B_2$, to form a polymer chain of the general form of $(AA-B_1B_1)_x$-$(AA-B_2B_2)_y$, in which x and y are determined by the relative incorporations of $B_1B_1$ and $B_2B_2$ into the polymer backbone. Alternatively, diamine co-monomers $A_1A_1$ and $A_2A_2$ can be reacted with a single di-acid monomer BB to form a polymer chain of the general form of $(A_1A_1-BB)_x$-$(A_2A_2-BB)_y$. Additionally, two diamine co-monomers $A_1A_1$ and $A_2A_2$ can be reacted with two di-acid co-monomers $B_1B_1$ and $B_2B_2$ to form a polymer chain of the general form $(A_1A_1-B_1B_1)_w$-$(A_1A_1-B_2B_2)_x$-$(A_2A_2-B_1B_1)_y$-$(A_2A_2-B_2B_2)_z$, where w, x, y, and z are determined by the relative incorporation of $A_1A_1$-$B_1B_1$, $A_1A_1$-$B_2B_2$, $A_2A_2$-$B_1B_1$, and $A_2A_2$-$B_2B_2$ into the polymer backbone. More than two di-acid co-monomers and/or more than two diamine co-monomers can also be used. Therefore, one or more diamine monomers can be polymerized with one or more di-acids, and the general form of the polymer is determined by varying the amount and types of monomers used.

There are many examples of monomers that can be used to make polymeric aerogels containing polyamic amide polymer. In some embodiments, the diamine monomer is a substituted or unsubstituted aromatic diamine, a substituted or unsubstituted alkyldiamine, or a diamine that can include both aromatic and alkyl functional groups. A non-limiting list of possible diamine monomers comprises 4,4'-oxydianiline (ODA), 3,4'-oxydianiline, 3,3'-oxydianiline, p-phenylenediamine, m-phenylenediamine, o-phenylenediamine, diaminobenzanilide, 3,5-diaminobenzoic acid, 3,3'-diaminodiphenylsulfone, 4,4'-diaminodiphenyl sulfones, 1,3-bis-(4-aminophenoxy)benzene, 1,3-bis-(3-aminophenoxy)benzene, 1,4-bis-(4-aminophenoxy)benzene, 1,4-bis-(3-aminophenoxy)benzene, 2,2-bis[4-(4-aminophenoxy)phenyl]-hexafluoropropane, 2,2-bis(3-aminophenyl)-1,1,1,3,3,3-hexafluoropropane, 4,4'-isopropylidenedianiline, 1-(4-aminophenoxy)-3-(3-aminophenoxy)benzene, 1-(4- aminophenoxy)-4-(3-aminophenoxy)benzene, bis-[4-(4-aminophenoxy)phenyl]sulfones, 2,2-bis[4-(3-aminophenoxy)phenyl]sulfones, bis(4-[4-aminophenoxy]phenyl) ether, 2,2'-bis-(4-aminophenyl)-hexafluoropropane (6F-diamine), 2,2'-bis-(4-phenoxyaniline) isopropylidene, meta-phenylenediamine, para-phenylenediamine, 1,2-diaminobenzene, 4,4'-diaminodiphenylmethane, 2,2-bis(4-aminophenyl) propane, 4,4'diaminodiphenyl propane, 4,4'-diaminodiphenyl sulfide, 4,4'-diaminodiphenylsulfone, 3,4'diaminodiphenyl ether, 4,4'-diaminodiphenyl ether, 2,6-diaminopyridine, bis(3-aminophenyl) diethyl silane, 4,4'-diaminodiphenyl diethyl silane, benzidine, dichlorobenzidine, 3,3'-dimethoxybenzidine, 4,4'-diaminobenzophenone, N,N-bis(4-aminophenyl)-n-butylamine, N,N-bis(4-aminophenyl)methylamine, 1,5-diaminonaphthalene, 3,3'-dimethyl-4,4'-diaminobiphenyl, 4-aminophenyl-3-aminobenzoate, N,N-bis(4-aminophenyl) aniline, bis(p-beta-amino-t-butylphenyl) ether, p-bis-2-(2-methyl-4-aminopentyl)benzene, p-bis(1,1-dimethyl-5-aminopentyl)benzene, 1,3-bis(4-aminophenoxy)benzene, m-xylenediamine, p-xylenediamine, 4,4'-diaminodiphenyl ether phosphine oxide, 4,4'-diaminodiphenyl N-methyl amine, 4,4'-diaminodiphenyl N-phenyl amine, amino-terminal polydimethylsiloxanes, amino-terminal polypropyleneoxides, amino-terminal polybutyleneoxides, 4,4'-Methylenebis(2-methylcyclohexylamine), 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, and 4,4'-methylenebisbenzeneamine, 2,2'-dimethylbenzidine, (also known as 4,4'-diamino-2,2'-dimethylbiphenyl (DMB)), bisaniline-p-xylidene, 4,4'-bis(4-aminophenoxy)biphenyl, 3,3'-bis(4 aminophenoxy)biphenyl, 4,4'-(1,4-phenylenediisopropylidene)bisaniline, and 4,4'-(1,3-phenylenediisopropylidene)bisaniline, or combinations thereof. In a specified embodiment, the diamine monomer is ODA, 2,2'-dimethylbenzidine, or both.

A non-limiting list of possible dianhydride ("diacid") monomers includes hydroquinone dianhydride, 3,3',4,4'-biphenyltetracarboxylic dianhydride (BPDA), pyromellitic dianhydride (PMDA), 3,3',4,4'-benzophenonetetracarboxylic dianhydride, 4,4'-oxydiphthalic anhydride, 3,3',4,4'-diphenylsulfonetetracarboxylic dianhydride, 4,4'-(4,4'-isopropylidenediphenoxy)bis(phthalic anhydride), 2,2-bis(3,4-dicarboxyphenyl) propane dianhydride, 4,4'-(hexafluoroisopropylidene)diphthalic anhydride, bis(3,4-dicarboxyphenyl) sulfoxide dianhydride, polysiloxane-containing dianhydride, 2,2',3,3'-biphenyltetracarboxylic dianhydride, 2,3,2',3'-benzophenonetetraearboxylic dianhydride, naphthalene-2,3,6,7-tetracarboxylic dianhydride, naphthalene-1,4,5,8-tetracarboxylie dianhydride, 4,4'-oxydiphthalic dianhydride, 3,3',4,4'-biphenylsulfone tetracarboxylic dianhydride, 3,4,9,10-perylene tetracarboxylic dianhydride, bis(3,4-dicarboxyphenyl) sulfide dianhydride, bis (3,4-dicarboxyphenyl) methane dianhydride, 2,2-bis(3,4-dicarboxyphenyl) propane dianhydride, 2,2-bis(3,4-dicarboxyphenyl) hexafluoropropane, 2,6-dichloronaphthalene-1,4,5,8-tetracarboxylic dianhydride, 2,7-dichloronapthalene-1,4,5,8-tetracarboxylic dianhydride, 2,3,6,7-tetrachloronaphthalene-1,4,5,8-tetracarboxylic dianhydride, phenanthrene, 8,9,10-tetracarboxylic dianhydride, pyrazine-2,3,5,6-tetracarboxylic dianhydride, benzene-1,2,3,4-tetracarboxylic dianhydride, and thiophene-2,3,4,5-tetracarboxylic dianhydride. In a specific embodiment, the dianhydride monomer is BPDA, PMDA, or both.

In some aspects, the molar ratio of anhydride to total diamine is from 0.4:1 to 1.6:1, 0.5:1 to 1.5:1, 0.6:1 to 1.4:1, 0.7:1 to 1.3:1, or specifically from 0.8:1 to 1.2:1. In further aspects, the molar ratio of dianhydride to multifunctional amine (e.g., triamine) is 2:1 to 140:1, 3:1 to 130:1, 4:1 to 120:1, 5:1 to 110:1, 6:1 to 100:1, 7:1 to 90:1, or specifically from 8:1 to 80:1.

Mono-anhydride groups can also be used. Non-limiting examples of mono-anhydride groups include 4-amino-1,8-naphthalic anhydride, endo-bicyclo[2.2.2]oct-5-ene-2,3-dicarboxylic anhydride, citraconic anhydride, trans-1,2-cyclohexanedicarboxylic anhydride, 3,6-dichlorophthalic anhydride, 4,5-dichlorophthalic anhydride, tetrachlorophthalic anhydride 3,6-difluorophthalic anhydride, 4,5-difluorophthalic anhydride, tetrafluorophthalic anhydride, maleic anhydride, 1-cyclopentene-1,2-dicarboxylic anhydride, 2,2-dimethylglutaric anhydride 3,3-dimethylglutaric anhydride, 2,3-dimethylmaleic anhydride, 2,2-dimethylsuccinic anhydride, 2,3-diphenylmaleic anhydride, phthalic anhydride, 3-methylglutaric anhydride, methylsuccinic anhydride, 3-nitrophthalic anhydride, 4-nitrophthalic anhydride, 2,3-pyrazinedicarboxylic anhydride, or 3,4-pyridinedicarboxylic anhydride. Specifically, the mono-anhydride group can be phthalic anhydride.

In another embodiment, the polymer compositions used to prepare layers of polymeric aerogel include multifunctional amine monomers with at least three primary amine functionalities. The multifunctional amine may be a substituted or unsubstituted aliphatic multifunctional amine, a substituted or unsubstituted aromatic multifunctional amine, or a multifunctional amine that includes a combination of an aliphatic and two aromatic groups, or a combination of an aromatic and two aliphatic groups. A non-limiting list of possible multifunctional amines include propane-1,2,3-triamine, 2-aminomethylpropane-1,3-diamine, 3-(2-aminoethyl)pentane-1,5-diamine, bis(hexamethylene)triamine, N',N'-bis(2-aminoethyl) ethane-1,2-diamine, N',N'-bis(3-aminopropyl) propane-1,3-diamine, 4-(3-aminopropyl) heptane-1,7-diamine, N',N'-bis(6-aminohexyl) hexane-1,6-diamine, benzene-1,3,5-triamine, cyclohexane-1,3,5-triamine, melamine, N-2-dimethyl-1,2,3-propanetriamine, diethylenetriamine, 1-methyl or 1-ethyl or 1-propyl or 1-benzyl-substituted diethylenetriamine, 1,2-dibenzyldiethylenetriamine, lauryldiethylenetriamine, N-(2-hydroxypropyl) diethylenetriamine, N,N-bis(1-methylheptyl)-N-2-dimethyl-1,2,3-propanetriamine, 2,4,6-tris(4-(4-aminophenoxy) phenyl)pyridine, N,N-dibutyl-N-2-dimethyl-1,2,3-propanetriamine, 4,4'-(2-(4-aminobenzyl) propane-1,3-diyl)dianiline, 4-((bis(4-aminobenzyl)amino)methyl) aniline, 4-(2-(bis(4-aminophenethyl)amino)ethyl) aniline, 4,4'-(3-(4-aminophenethyl) pentane-1,5-diyl)dianiline, 1,3,5-tris(4-aminophenoxy)benzene (TAPOB), 4,4',4"-methanetriyltrianiline, N,N,N',N'-Tetrakis(4-aminophenyl)-1,4-phenylenediamine, a polyoxypropylenetriamine, octa(aminophenyl)polyhedral oligomeric silsesquioxane, or combinations thereof. A specific example of a polyoxypropylenetriamine is JEFFAMINE® T-403 from Huntsman Corporation, The Woodlands, TX USA. In a specific embodiment, the aromatic multifunctional amine may be 1,3,5-tris(4-aminophenoxy)benzene or 4,4',4"-methanetriyltrianiline. In some embodiments, the multifunctional amine includes three primary amine groups and one or more secondary and/or tertiary amine groups, for example, N',N'-bis(4-aminophenyl)benzene-1,4-diamine.

Non-limiting examples of capping agents or groups include amines, maleimides, nadimides, acetylene, biphenylenes, norbornenes, cycloalkyls, and N-propargyl and specifically those derived from reagents including 5-norbornene-2,3-dicarboxylic anhydride (nadic anhydride, NA), methyl-nadic anhydride, hexachloro-nadic anhydride, cis-4-cyclohexene-1,2-dicarboxylic anhydride, 4-amino-N-propargylphthalimide, 4-ethynylphthalic anhydride, and maleic anhydride.

The characteristics or properties of the final polymer are significantly impacted by the choice of monomers that are used to produce the polymer. Factors to be considered when selecting monomers include the properties of the final polymer, such as the flexibility, thermal stability, coefficient of thermal expansion (CTE), coefficient of hydroscopic expansion (CHE), and any other properties specifically desired, as well as cost. Often, certain important properties of a polymer for a particular use can be identified. Other properties of the polymer may be less significant, or may have a wide range of acceptable values; so many different monomer combinations could be used.

In some instances, the backbone of the polymer can include substituents. The substituents (e.g., oligomers, functional groups, etc.) can be directly bonded to the backbone or linked to the backbone through a linking group (e.g., a tether or a flexible tether). In other embodiments, a compound or particles can be incorporated (e.g., blended and/or encapsulated) into the polyimide structure without being covalently bound to the polyimide structure. In some instances, the incorporation of the compound or particles can be performed during the polyamic reaction process. In some instances, particles can aggregate, thereby producing polyimides having domains with different concentrations of the non-covalently bound compounds or particles.

Specific properties of a polyimide can be influenced by incorporating certain compounds into the polyimide. The selection of monomers is one way to influence specific properties. Another way to influence properties is to add a compound or property modifying moiety to the polyimide.

C. Preparation of Layers of Polymeric Aerogel

Polymeric aerogel films that can be used in at least some of the present laminates are commercially-available. Non-limiting examples of such films include the Blueshift AeroZero® rolled thin film (available from Blueshift Materials, Inc. (Spencer, Massachusetts) and Airloy® films (available from Aerogel Technologies, LLC), with the Blueshift AeroZero® rolled thin film being preferred in some aspects.

Further, and in addition to the processes discussed below, polymeric aerogels (films, stock shapes or monoliths, etc.) can be made using the methodology described in International Patent Application Publication Nos. WO 2014/189560 to Rodman et al., 2017/07888 to Sakaguchi et al., 2018/078512 to Yang et al., 2018/140804 to Sakaguchi et al., and 2019/006184 to Irvin et al., International Patent Application No. PCT/US2019/029191 to Ejaz et al., U.S. Patent Application Publication No. 2017/0121483 to Poe et al., and/or U.S. Pat. No. 9,963,571 to Sakaguchi et al., all of which are incorporated herein by reference in their entireties.

The following provides non-limiting processes that can be used to make layers of polymeric aerogel suitable for use in the present laminates. These processes can include: (1) preparation of the polymer gel; (2) optional solvent exchange, (3) drying of the polymeric solution to form the aerogel; and (4) attaching a polymeric aerogel film on a substrate.

1. Formation of a Polymer Gel

The first stage in the synthesis of an aerogel can be the synthesis of a polymerized gel. For example, if a polyimide aerogel is desired, at least one acid monomer can be reacted with at least one diamino monomer in a reaction solvent to form a polyamic acid. As discussed above, numerous acid monomers and diamino monomers may be used to synthesize the polyamic acid. In one aspect, the polyamic acid is contacted with an imidization catalyst in the presence of a chemical dehydrating agent to form a polymerized polyimide gel via an imidization reaction. "Imidization" is defined as the conversion of a polyimide precursor into an imide. Any imidization catalyst suitable for driving the conversion of polyimide precursor to the polyimide state is suitable. Non-limiting examples of chemical imidization catalysts include pyridine, methylpyridines, quinoline, isoquinoline, 1,8-diazabicyclo[5.4.0]undec-7-ene (DBU), triethylenediamine, lutidine, N-methylmorpholine, triethylamine, tripropylamine, tributylamine, other trialkylamines, 2-methyl imidazole, 2-ethyl-4-methylimidazole, imidazole, other imidazoles, and combinations thereof. Any dehydrating agent suitable for use in formation of an imide ring from an amic acid precursor is suitable for use in the methods of the present invention. Preferred dehydrating agents comprise at least one compound selected from the group consisting of acetic anhydride, propionic anhydride, n-butyric anhydride, benzoic, anhydride, trifluoroacetic anhydride, phosphorus trichloride, and dicyclohexylcarbodiimide.

In one aspect of the current invention, one or more diamino monomers and one or more multifunctional amine monomers are premixed in one or more solvents and then treated with one or more dianhydrides (e.g., di-acid monomers) that are added in sequentially smaller amounts at pre-defined time increments while monitoring the viscosity. The desired viscosity of the polymerized solution can range from 50 to 20,000 cP or specifically 500 to 5,000 cP. By performing the reaction using incremental addition of dianhydride while monitoring viscosity, a non-crosslinked aerogel can be prepared. For instance, a triamine monomer (23 equiv.) can be added to the solvent to give a 0.0081 molar solution. To the solution, a first diamine monomer (280 equiv.) can be added, followed by a second diamine monomer (280 equiv.). Next a dianhydride (552 total equiv.) can be added in sequentially smaller amounts at pre-defined time increments while monitoring the viscosity. The dianhydride can be added until the viscosity reaches 1,000 to 1,500 cP. For example, a first portion of dianhydride can be added, the reaction can be stirred (e.g., for 20 minutes), a second portion of dianhydride can be added, and a sample of the reaction mixture can then be analyzed for viscosity. After stirring for additional time (e.g., for 20 minutes), a third portion of dianhydride can be added, and a sample can be taken for analysis of viscosity. After further stirring for a desired period of time (e.g., 10 hours to 12 hours), a mono-anhydride (96 equiv.) can be added. After having reached the target viscosity, the reaction mixture can be stirred for a desired period of time (e.g., 10 hours to 12 hours) or the reaction is deemed completed.

The reaction temperature for the gel formation can be determined by routine experimentation depending on the starting materials. In a preferred embodiment, the temperature can be greater than or equal to any one of, or between any two of: 15° C., 20° C., 30° C., 35° C., 40° C., and 45° C. After a desired amount of time (e.g., about 2 hours), the product can be isolated (e.g., filtered), after which a nitrogen-containing hydrocarbon (828 equiv.) and dehydration agent (1214 equiv.) can be added. The addition of the nitrogen-containing hydrocarbon and/or dehydration agent can occur at any temperature. In some embodiments, the nitrogen-containing hydrocarbon and/or dehydration agent is added to the solution at 20° C. to 28° C. (e.g., room temperature) and stirred for a desired amount of time at that temperature. In some instances, after addition of nitrogen-containing hydrocarbon and/or dehydration agent, the solution temperature is raised up to 150° C.

The reaction solvent can include dimethylsulfoxide (DMSO), diethylsulfoxide, N,N-dimethylformamide (DMF), N,N-diethylformamide, N,N-dimethylacetamide (DMAc), N,N-diethylacetamide, N-methyl-2-pyrrolidone (NMP), 1-methyl-2-pyrrolidinone, N-cyclohexyl-2-pyrrolidone, 1,13-dimethyl-2-imidazolidinone, diethyleneglycoldimethoxyether, 0-dichlorobenzene, phenols, cresols, xylenol, catechol, butyrolactones, hexamethylphosphoramide, and mixtures thereof. The reaction solvent and other reactants can be selected based on the compatibility with the materials and methods applied; i.e., if the polymerized polyamic amide gel is to be cast onto a support film, injected into a moldable part, or poured into a shape for further processing into a workpiece. In a specific embodiment, the reaction solvent is DMSO.

While keeping the above in mind, the introduction of macropores into the aerogel polymeric matrix, as well as the amount of such macropores present, can be performed in the manner described in the Summary. In one non-limiting manner, the formation of macropores versus smaller mesopores and micropores can be primarily controlled by controlling the polymer/solvent dynamics during gel formation. By doing so, the pore structure can be controlled, and the quantity and volume of macroporous, mesoporous, and microporous cells can be controlled. For example, a curing additive that reduces the solubility of the polymers being formed during polymerization, such as 1,4-diazabicyclo[2.2.2]octane, can produce a polymer gel containing a higher number of macropores as compared to another curing additive that improves the resultant polymer solubility, such as triethylamine. In another specific non-limiting example, when forming a polyimide aerogel, increasing the ratio of rigid amines (e.g., p-phenylenediamine (p-PDA)) to more flexible diamines (e.g.,-ODA) incorporated into the polymer backbone can favor the formation of macropores over smaller mesopores and micropores.

The polymer solution may optionally be cast onto a casting sheet covered by a support film for a period of time. Casting can include spin casting, gravure coating, three roll coating, knife over roll coating, slot die extrusion, dip coating, Meyer rod coating, or other techniques. In one embodiment, the casting sheet is a polyethylene terephthalate (PET) casting sheet. After a passage of time, the polymerized reinforced gel is removed from the casting sheet and prepared for the solvent exchange process. In some embodiments, the cast film can be heated in stages to elevated temperatures to remove solvent and convert the amic acid functional groups in the polyamic acid to imides with a cyclodehydration reaction, also called imidization. In some instances, polyamic acids may be converted in solution to polyimides with the addition of the chemical dehydrating agent, catalyst, and/or heat.

In some embodiments, the polyimide polymers can be produced by preparing a polyamic acid polymer in the reaction vessel. The polyamic acid is then formed into a sheet or a film and subsequently processed with catalysts or heat and catalysts to convert the polyamic acid to a polyimide.

Wet gels used to prepare aerogels may be prepared by any known gel-forming techniques, for example adjusting the pH and/or temperature of a dilute metal oxide sol to a point where gelation occurs.

2. Optional Solvent Exchange

After the polymer gel is synthesized, it may be desirable in certain instances to conduct a solvent exchange wherein the reaction solvent is exchanged for a more desirable second solvent. Accordingly, in one embodiment, a solvent exchange can be conducted wherein the polymerized gel is placed inside of a pressure vessel and submerged in a mixture comprising the reaction solvent and the second solvent. Then, a high-pressure atmosphere is created inside of the pressure vessel, thereby forcing the second solvent into the polymerized gel and displacing a portion of the reaction solvent. Alternatively, the solvent exchange step may be conducted without the use of a high-pressure environment. It may be necessary to conduct a plurality of rounds of solvent exchange. In some embodiments, solvent exchange is not necessary.

The time necessary to conduct the solvent exchange will vary depending upon the type of polymer undergoing the exchange as well as the reaction solvent and second solvent being used. In one embodiment, each solvent exchange can take from 1 to 168 hours or any period time there between, including 2, 3, 4, 5, 6, 7, 8, 9, 10, 11, 12, 13, 14, 15, 16, 17, 18, 19, 20, 21, 22, or 23, 24, 25, 50, 75, 100, 125, 150, 155, 160, 165, 166, 167, or 168 hours. In another embodiment, each solvent exchange can take approximately 1 to 60 minutes, or about 30 minutes. Exemplary second solvents include methanol, ethanol, 1-propanol, 2-propanol, 1-butanol, 2-butanol, isobutanol, tert-butanol, 3-methyl-2-butanol, 3,3-dimethyl-2-butanol, 2-pentanol, 3-pentanol, 2,2-dimethylpropan-1-ol, cyclohexanol, diethylene glycol, cyclohexanone, acetone, acetyl acetone, 1,4-dioxane, diethyl ether, dichloromethane, trichloroethylene, chloroform, carbon tetrachloride, water, and mixtures thereof. In certain non-limiting embodiments, the second solvent can have a suitable freezing point for performing supercritical or subcritical drying steps. For example, tert-butyl alcohol has a freezing point of 25.5° C. and water has a freezing point of 0° C. under one atmosphere of pressure. Alternatively, and as discussed below, however, the drying can be performed without the use of supercritical or subcritical drying steps, such as by evaporative drying techniques.

The temperature and pressure used in the solvent exchange process may be varied. The duration of the solvent exchange process can be adjusted by performing the solvent exchange at a varying temperatures or atmospheric pressures, or both, provided that the pressure and temperature inside the pressure vessel do not cause either the first solvent or the second solvent to leave the liquid phase and become gaseous phase, vapor phase, solid phase, or supercritical fluid. Generally, higher pressures and/or temperatures decrease the amount of time required to perform the solvent exchange, and lower temperatures and/or pressures increase the amount of time required to perform the solvent exchange.

3. Cooling and Drying

In one embodiment, after solvent exchange, the polymerized gel can be exposed to supercritical drying. In this instance, the solvent in the gel can be removed by supercritical $CO_2$ extraction.

In another embodiment, after solvent exchange, the polymerized gel can be exposed to subcritical drying. In this instance, the gel can be cooled below the freezing point of the second solvent and subjected to a freeze drying or lyophilization process to produce the aerogel. For example, if the second solvent is water, then the polymerized gel is cooled to below 0° C. After cooling, the polymerized gel can be subjected to a vacuum for a period of time to allow sublimation of the second solvent.

In still another embodiment, after solvent exchange, the polymerized gel can be exposed to subcritical drying with optional heating after the majority of the second solvent has been removed through sublimation. In this instance the partially dried gel material is heated to a temperature near or above the boiling point of the second solvent for a period of time. The period of time can range from a few hours to several days, although a typical period of time is approximately 4 hours. During the sublimation process, a portion of the second solvent present in the polymerized gel is removed, leaving a gel that can have macropores, mesopores, or micropores, or any combination thereof or all of such pore sizes. After the sublimation process is complete, or nearly complete, the aerogel has been formed.

In yet another embodiment after solvent exchange, the polymerized gel can be dried under ambient conditions, for example, by removing the solvent under a stream of gas (e.g., air, anhydrous gas, inert gas (e.g., nitrogen ($N_2$) gas), etc.). Still further, passive drying techniques can be used such as simply exposing the gel to ambient conditions without the use of a gaseous stream.

Once cooled or dried, the films and stock shapes can be configured for use in the present laminates. For example, the films or stock shapes can be processed into desired shapes (e.g., by cutting or grinding) such as square shapes, rectangular shapes, circular shapes, triangular shapes, irregular shapes, random shapes, etc. Also, and as discussed above, the films or stock shapes can be affixed to a support material such as with an adhesive. In alternative embodiments, a support material can be incorporated into the matrix of the polymeric aerogel, which is discussed below.

4. Incorporation of a Reinforcing Layer into the Matrix of the Polymeric Aerogel In addition to the methods discussed above with respect to the use of adhesives for attaching a polymeric aerogel to a support material, an optional embodiment of the present invention can include incorporation of the support material into the polymeric matrix to create a reinforced polymeric aerogel without the use of adhesives. Notably, during manufacture of a non-reinforced polymer aerogel, a reinforcing support film can be used as a carrier to support the gelled film during processing. During rewinding, the gelled film can be irreversibly pressed into the carrier film. Pressing the gelled film into the carrier film can provide substantial durability improvement. In another instance, during the above-mentioned solvent casting step, the polymer solution can be cast into a reinforcement or support material.

The substrate selection and direct casting can allow optimization of (e.g., minimization) of the thickness of the resulting reinforced aerogel material. This process can also be extended to the production of fiber-reinforced polymer aerogels-internally reinforced polyimide aerogels are provided as an example. The process can include: (a) forming a polyamic acid solution from a mixture of dianhydride and diamine monomers in a polar solvent such as DMSO, DMAc, NMP, or DMF; (b) contacting the polyamic acid solution with chemical curing agents listed above and a chemical dehydrating agent to initiate chemical imidization; (c) casting the polyamic acid solution onto a fibrous support prior to gelation and allow it to permeate it; (d) allowing the catalyzed polyamic acid solution to gel around, and into, the fibrous support during chemical imidization; (e) optionally performing a solvent exchange, which can facilitate drying; and (f) removal of the transient liquid phase contained within the gel with supercritical, subcritical, or ambient drying to give an internally reinforced aerogel.

EXAMPLES

The present invention will be described in greater detail by way of specific examples. The following examples are offered for illustrative purposes only and are not intended to limit the invention in any manner. Those of ordinary skill in the art will readily recognize a variety of noncritical parameters, which can be changed or modified to yield essentially the same results.

TABLE 1 lists the acronyms for the compounds used in the following Examples.

TABLE 1

| Acronym | Name |
| --- | --- |
| BPDA | 3,3',4,4'-biphenyltetracarboxylic dianhydride |
| DMB | 4,4'-Diamino-2,2'-dimethylbiphenyl |
| DMSO | Dimethylsulfoxide |
| PA | Phthalic anhydride |
| PMDA | Pyromellitic dianhydride |
| ODA | 4,4'-Oxydianiline |
| TAPOB | 1,3,5-Tris(4-aminophenoxy) benzene |

Structures of the starting materials are shown below.

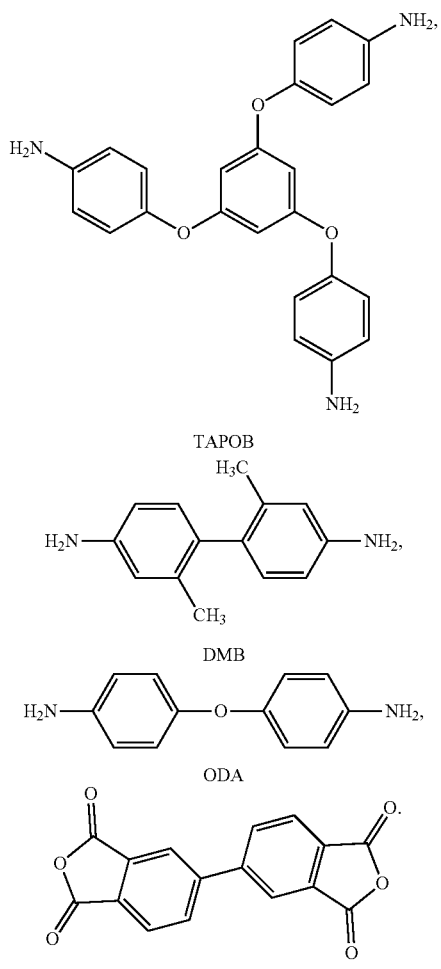

TAPOB

DMB

ODA

BPDA

Example 1

(Preparation of a Highly Branched BPDA/DMB-ODA Polyimide)

A reaction vessel with a mechanical stirrer and a water jacket was used. The flow of the water through the reaction vessel jacket was adjusted to maintain temperature in the range of 18-35° C. The reaction vessel was charged with DMSO (108.2 lbs. 49.1 kg), and the mechanical stirrer speed was adjusted to 120-135 rpm. TAPOB (65.13 g) was added to the solvent. To the solution was added DMB (1081.6 g), followed by ODA (1020.2 g). A first portion of BPDA (1438.4 g) was then added. After stirring for 20 minutes, a sample of the reaction mixture was analyzed for viscosity using a Brookfield DV1 viscometer (Brookfield, AMETEK, U.S.A.). A second portion of BPDA (1407.8 g) was added, and the reaction mixture was stirred for 20 additional minutes. A third portion of BPDA (138.62 g) was added, and the reaction mixture was stirred for 20 minutes. A sample of the reaction mixture was analyzed for viscosity. After stirring for 8 hours, PA (86.03 g) was added. The resulting reaction mixture was stirred until no more solids were visible. After 2 hours, the product was removed from the reaction vessel, filtered, and weighed.

Example 2

(Preparation of a Highly Branched Polyimide Aerogel Monolith by Freeze Drying)

Figure 7:
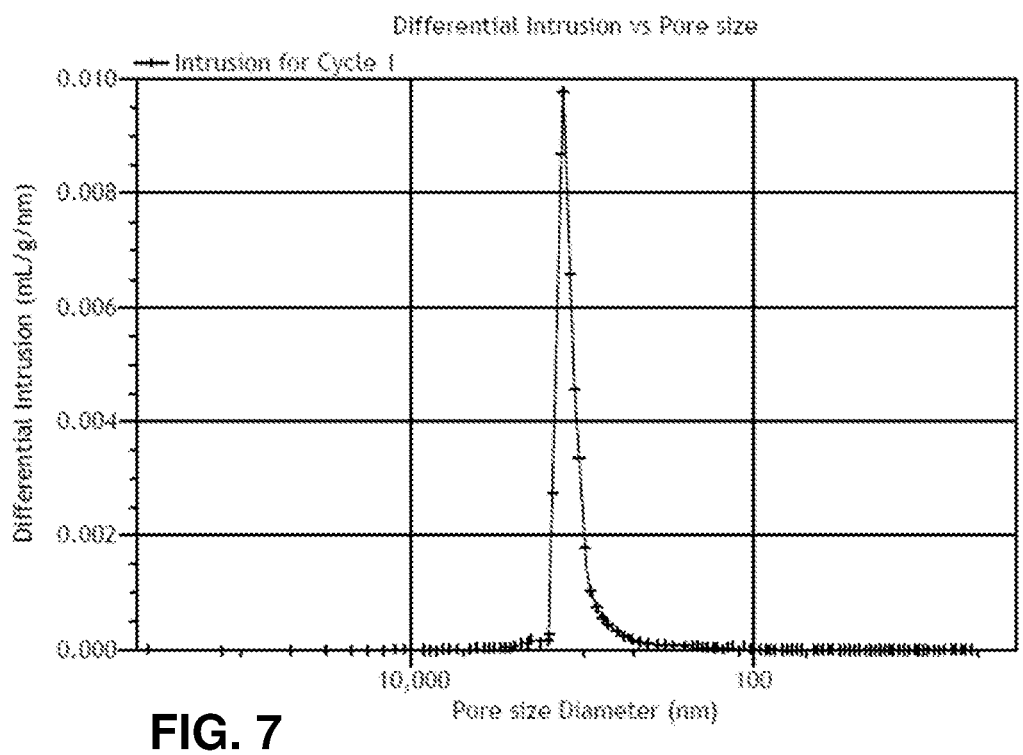
FIG. 7 is a distribution of pore size diameter for a first non-limiting aerogel of the present invention.

The resin (about 10,000 grams) prepared in Example 1 was mixed with triethylamine (about 219 grams) and acetic anhydride (about 561 grams) for five minutes. After mixing, the resultant solution was poured into a square 15"×15" mold and left for 48 hours. The gelled shape was removed from the mold, and placed into an acetone bath. After immersion for 24 hours, the acetone bath was exchanged with fresh acetone. The soak and exchange process was repeated five times. After the final exchange, the bath was replaced with tertiary butyl alcohol. After immersion for 24 hours, the tertiary butyl alcohol bath was exchanged for fresh tertiary butyl alcohol. The soak and exchange process was repeated three times. The part was subsequently flash frozen and subjected to subcritical drying for 96 hours in at 5° C., followed by drying in vacuum at 50° C. for 48 hours. The final recovered aerogel part had an open-cell structure as observed by scanning electron microscopy (SEM) performed on a Phenom Pro Scanning Electron Microscope (Phenom-World, the Netherlands), exhibited a density of 0.22 g/cm$^3$ and a porosity of 88.5% as measured according to ASTM D4404-10 with a Micromeritics® AutoPore V 9605 Automatic Mercury Penetrometer (Micromeritics® Instrument Corporation, U.S.A.), a compression modulus of 2.2 MPa as determined by American Standard Testing Method (ASTM) D395-16, and a compression strength at 25% strain of 3.5 MPa as determined by ASTM D395-16. The distribution of pore sizes was measured according to ASTM D4404-10 using a Micromeritics® AutoPore V 9605 Automatic Mercury Penetrometer (Micromeritics® Instrument Corporation, U.S.A.), and the distribution of pore diameters is provided in FIG. 7. From the data it was determined that 100% of the pores were macropores and that the average pore diameter was about 1,200 nm, thus confirming that a macroporously-structured aerogel was produced.

Example 3

(Preparation of a Highly Branched Polyimide Aerogel Monolith by Thermal Drying)

The resin (about 10,000 grams) prepared in Example 1 was mixed with triethylamine (about 219 grams) and acetic anhydride (about 561 grams) for five minutes at a temperature of 10-35° C. After mixing, the resultant solution was poured into a square 15"×15" mold and left for 48 hours. The gelled shape was removed from the mold and placed into an acetone bath. After immersion for 24 hours, the acetone bath was exchanged with fresh acetone. The soak and exchange process was repeated five times. After the final exchange, the part was dried with an ambient (about 20 to 30° C.) drying process to evaporate a majority of the acetone over 48 hours followed by thermal drying at 50° C. for 4 hours, 100° C. for 2 hours, 150° C. for 1 hour, and then 200° C. for 30 minutes. The final recovered aerogel had similar properties as observed in Example 2.

Example 4

(Preparation of a Highly Branched Polyimide)

TAPOB (about 2.86 g) was added to the reaction vessel charged with about 2,523.54 g DMSO as described in Example 1 at a temperature of 18-35° C. To the solution was added a first portion of DMB (about 46.75 g), followed by a first portion of ODA (about 44.09 g). After stirring for about 20 minutes, a first portion of BPDA (about 119.46 g) was added. After stirring for about 20 minutes, TAPOB (about 2.86 g), DMB (about 46.75 g), and ODA (about 44.09 g) were added. After stirring for about 20 minutes, BPDA (about 119.46 g) was added. After stirring for about 20 minutes, TAPOB (about 2.86 g), DMB (about 46.75 g), and ODA (about 44.09 g) were added. After stirring for about 20 minutes, BPDA (about 119.46 g) was added. After stirring for about 8 hours, PA (about 50.12 g) was added. The resulting reaction mixture was stirred until no more solids were visible. After about 2 hours, the product was removed from the reaction vessel, filtered, and weighed.

Example 5

(Preparation of a Highly Branched Polyimide Aerogel Monolith by Freeze Drying)

Figure 8:
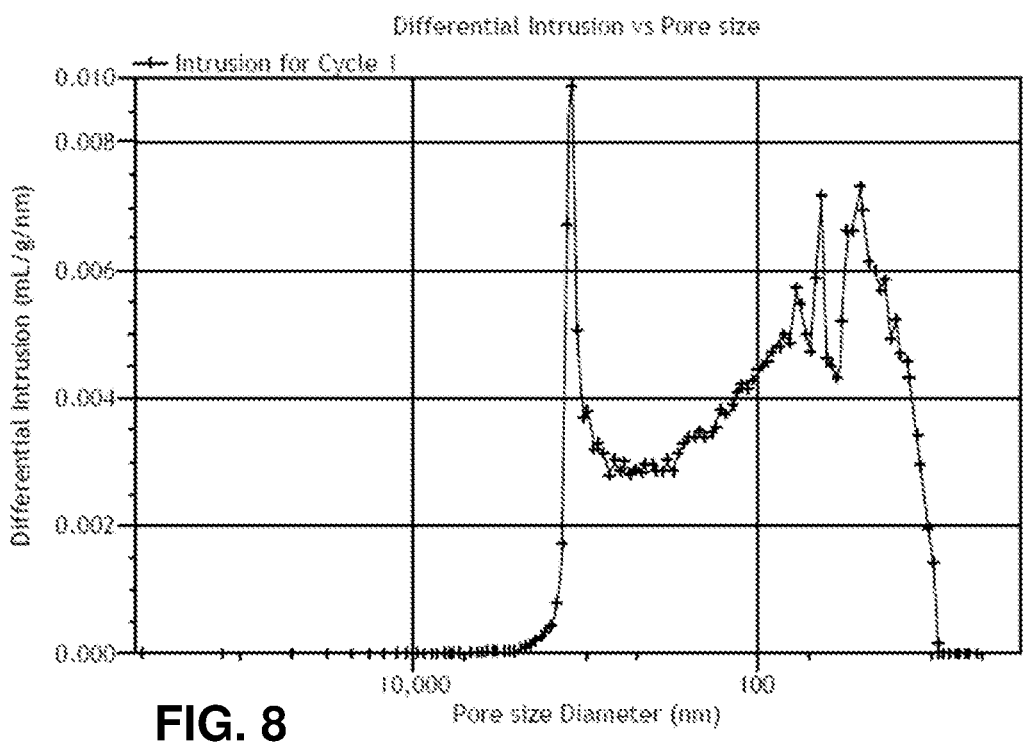
FIG. 8 is a distribution of pore size diameter for a second non-limiting aerogel of the present invention.

The resin (about 400 grams) prepared in Example 4 was mixed with 2-methylimidazole (about 53.34 grams) for five minutes and then benzoic anhydride (about 161.67 grams) for five minutes at a temperature of 18-35° C. After mixing, the resultant solution was poured into a square 3"×3" mold and placed in an oven at 75° C. for 30 minutes and then left overnight at room temperature. The gelled shape was removed from the mold, and placed into an acetone bath. After immersion for 24 hours, the acetone bath was exchanged with fresh acetone. The soak and exchange process was repeated five times. After the final exchange, the bath was replaced with tertiary butyl alcohol. After immersion for 24 hours, the tertiary butyl alcohol bath was exchanged for fresh tertiary butyl alcohol. The soak and exchange process was repeated three times The part was subsequently frozen on a shelf freezer, and subjected to subcritical drying for 96 hours in at 5° C., followed by drying in vacuum at 50° C. for 48 hours. The final recovered aerogel part had an open-cell structure as observed by scanning electron microscopy (SEM) performed on a Phenom Pro Scanning Electron Microscope (Phenom-World, the Netherlands), and exhibited a density of 0.15 g/cm$^3$ and a porosity of 92.2% as measured according to ASTM D4404-10 with a Micromeritics® AutoPore V 9605 Automatic Mercury Penetrometer (Micromeritics® Instrument Corporation, U.S.A.). The distribution of pore sizes were measured according to ASTM D4404-10 using a Micromeritics® AutoPore V 9605 Automatic Mercury Penetrometer (Micromeritics® Instrument Corporation, U.S.A.), and the distribution of pore diameters is shown in FIG. 8. From the data, it was determined that the 96.3% of the shaped aerogel's pore volume was made up of pores having an average pore diameter of greater than 50 nm, and thus a macroporously-structured aerogel was formed.

Example 6

(Preparation of a Highly Branched Polyimide)

TAPOB (about 2.05 g) was added to the reaction vessel charged with about 2,776.57 g DMSO as described in Example 1 at a temperature of 18-35° C. To the solution was added a first portion of DMB (about 33.54 g), followed by a first portion of ODA (about 31.63 g). After stirring for about 20 minutes, a first portion of PMDA (about 67.04 g) was added. After stirring for about 20 minutes, TAPOB (about 2.05 g), DMB (about 33.54 g), and ODA (about 31.63 g) were added. After stirring for about 20 minutes, PMDA (about 67.04 g) was added. After stirring for about 20 minutes, TAPOB (about 2.05 g), DMB (about 33.54 g), and ODA (about 31.63 g) were added. After stirring for about 20 minutes, PMDA (about 67.04 g) was added. After stirring for about 8 hours, PA (about 18.12 g) was added. The resulting reaction mixture was stirred until no more solids were visible. After about 2 hours, the product was removed from the reaction vessel, filtered, and weighed.

Example 7

(Preparation of a Highly Branched Polyimide Aerogel Monolith by Freeze Drying)

Figure 9:
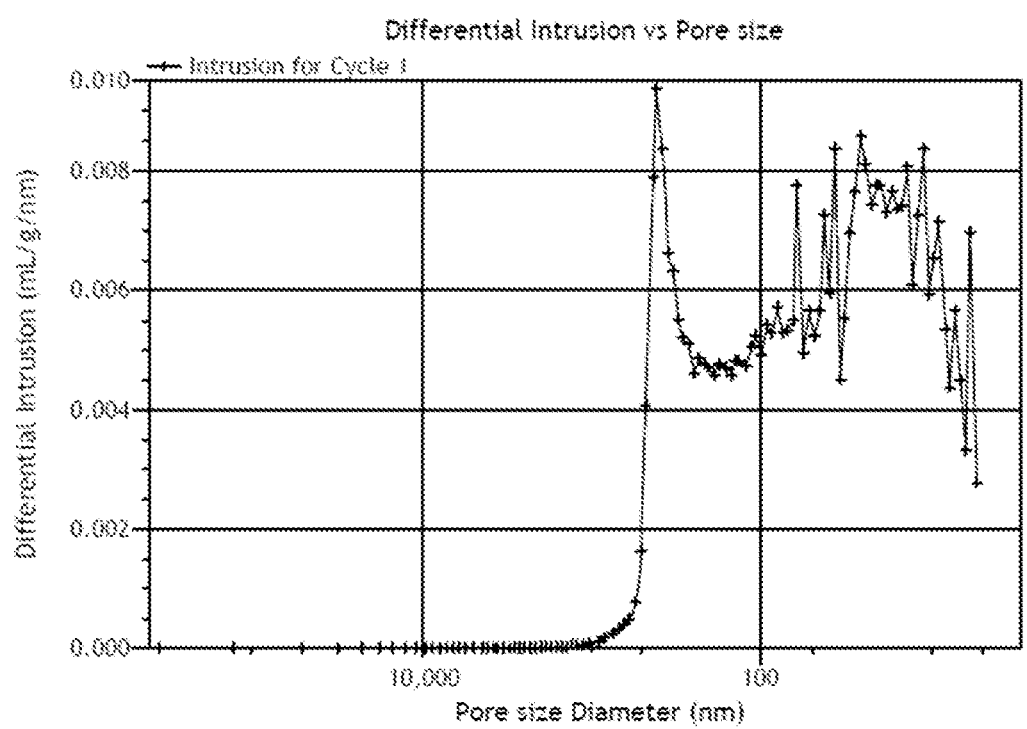
FIG. 9 is a distribution of pore size diameter for a third non-limiting aerogel of the present invention.

The resin (about 400 grams) prepared in Example 6 was mixed with 2-methylimidazole (about 40.38 grams) for five minutes and then benzoic anhydride (about 122.38 grams) for five minutes at a temperature of 18-35° C. After mixing, the resultant solution was poured into a square 3"×3" mold and placed in an oven at 75° C. for 30 minutes and then left overnight at room temperature. The gelled shape was removed from the mold, and placed into an acetone bath. After immersion for 24 hours, the acetone bath was exchanged with fresh acetone. The soak and exchange process was repeated five times. After the final exchange, the bath was replaced with tertiary butyl alcohol. After immersion for 24 hours, the tertiary butyl alcohol bath was exchanged for fresh tertiary butyl alcohol. The soak and exchange process was repeated three times. The part was subsequently frozen on a shelf freezer and subjected to subcritical drying for 96 hours at 5° C., followed by drying in vacuum at 50° C. for 48 hours. The final recovered aerogel part had an open-cell structure as observed by scanning electron microscopy (SEM) performed on a Phenom Pro Scanning Electron Microscope (Phenom-World, the Netherlands) and exhibited a density of 0.23 g/cm$^3$ and porosity of 82.7% as measured according to ASTM D4404-10 with a Micromeritics® AutoPore V 9605 Automatic Mercury Penetrometer (Micromeritics® Instrument Corporation, U.S.A.). The distribution of pore sizes was measured according to ASTM D4404-10 using a Micromeritics® AutoPore V 9605 Automatic Mercury Penetrometer (Micromeritics® Instrument Corporation, U.S.A.), and the distribution of pore diameters is shown in FIG. 9. From the data, it was determined that 90.6% of the aerogel's pore volume was made up of pores having an average pore diameter of greater than 50 nm.

Example 8

(Preparation of a Highly Branched Polyamic Film)

A reaction vessel with a mechanical stirrer and a water jacket was employed. The flow of the water through the reaction vessel jacket was adjusted to maintain temperature in the range of 20-28° C. The reaction vessel was charged with DMSO (108.2 lbs. 49.1 kg), and the mechanical stirrer speed was adjusted to 120-135 rpm. TAPOB (65.03 g) was added to the solvent. To the solution was added DMB (1,080.96 g), followed by ODA (1,018.73 g). A first portion of BPDA (1,524.71 g) was added. After stirring for 20 minutes, a sample of the reaction mixture was analyzed for viscosity. A second portion of BPDA (1,420.97 g) was added, and the reaction mixture was stirred for 20 additional minutes. A sample of the reaction mixture was analyzed for viscosity. A third portion of BPDA (42.81 g) was added, and the reaction mixture was stirred for 20 additional minutes. A sample of the reaction mixture was analyzed for viscosity. After stirring for 8 hours, PA (77.62 g) was added. The resulting reaction mixture was stirred until no more solid was visible. After 2 hours, the resin was removed from the reaction vessel, filtered, and weighed.

The resin (10,000 grams) was mixed with 2-methylimidazole (250 grams) for five minutes. Benzoic anhydride (945 grams) was added, and the solution mixed an additional five minutes. After mixing, the resultant solution was poured onto a moving polyester substrate that was heated in an oven at 100° C. for 30 seconds. The gelled film was collected and placed into an acetone bath. After immersion for 24 hours, the acetone bath was exchanged for fresh acetone. The soak and exchange process was repeated six times. After the final exchange, the gelled film was removed. The acetone solvent was evaporated under a stream of air at room temperature and subsequently dried for 2 hours at 200° C. The final recovered aerogel part had an open-cell structure as observed by scanning electron microscopy (SEM) performed on a Phenom Pro Scanning Electron Microscope (Phenom-World, the Netherlands) and exhibited a density of 0.20 g/cm$^3$ and a porosity of >80% as measured according to ASTM D4404-10 with a Micromeritics® AutoPore V 9605 Automatic Mercury Penetrometer (Micromeritics® Instrument Corporation, U.S.A.). The final recovered film exhibited a tensile strength and elongation of 1200 psi (8.27 MPa) and 14%, respectively, at room temperature as measured according to ASTM D882-02. The film had an average pore size of 400 nm.

Example 9

(Preparation of a Copper-Clad Polyimide Aerogel Laminate)

A laminate having a polyimide aerogel layer adhered between two copper layers was prepared by thermal lamination of the aerogel film with an adhesive sheet on either side of the aerogel film. The thickness of each of the copper foil layers was 1.4 mils, and the polyimide aerogel layer was a Blueshift AeroZero® film having a thickness of 139.7 micron (5.5 mils). Prior to lamination, the AeroZero® film was dried in a convection oven at 120° C. for 30 min. After assembly of the aerogel film between two adhesive sheets with copper foil layers on top, the samples were placed in a vacuum press. Three different low Dk/Df adhesives were used to make the copper clad laminates: Teflon FEP (Dupont), Pyralux GPL (Dupont) and TSU 510 (ToyoChem).

The press was heated to 180° C., using a temperature ramp of 5° C./min and pressure increase from 4 psi to 300 psi. The press was then kept isothermal at 180° C. ranging from 10 minutes to 60 minutes depending on the type of adhesive used. The press was then cooled to 50° C., Temperature at 5° C./min, holding the pressure at 300 psi.

Example 10

(Dielectric Properties of Polyimide Aerogel Film)

Permittivity (Dk) and Loss Tangent (Df) properties of the Blueshift AeroZero® film at 1 MHz and 1 GHz were measured per IPC TM-650 Method 2.5.5.9. parallel plate method. The samples were conditioned at 23±5° C. and 50±5% RH for a minimum of 24 hours prior to testing. Thickness of the polyimide aerogel film used was 148 microns. The dielectric properties are listed in Table 1.

TABLE 1

| Frequency. | Average Dk | Average Df |
|---|---|---|
| 1 MHZ | 1.400 | 0.0006 |
| 1 GHz | 1.500 | 0.0006 |

Example 11

(Dielectric Properties of Polyimide Aerogel Film at High Frequency)

The dielectric constant (Dk) and loss tangent (Df) of a polyimide aerogel film of thickness 157.8 micron was measured at 10 GHz using a Damaskos Thin Sheet tester. The results were Dk of 1.45 and Df of 0.0046.

Example 12

(Dielectric Properties of Polyimide Aerogel Stockshape)

The dielectric constant (Dk) and loss tangent (Df) of a polyimide aerogel sample of thickness 10.2 mm were measured at room temperature (22° C., 22% R.H.) with a DI Model 08 Thin Sheet Tester and a DI Model 900T Open Resonator using an Anritsu VectorStar vector network analyzer under the control of CAVITY™ for Macintosh OS X. The Thin Sheet Tester measurement follows ASTM D 2520 Part C. Table 2 shows the average dielectric constants (Dk) and loss tangents (Df) measured in four orientations (X1, X2, Y1 and Y2) with a Model 08 Thin Sheet Tester.

TABLE 2

| Freq. GHz | Average Dk | Average Df |
|---|---|---|
| 0.8 | 1.243 | 0.00042 |
| 1.3 | 1.245 | 0.00050 |
| 2.5 | 1.248 | 0.00053 |
| 4.5 | 1.251 | 0.00073 |
| 7.2 | 1.254 | 0.00068 |

Table 3 shows the average dielectric constants (Dk) and loss tangents (Df) measured in two orientations (X, Y) with a Model 900T Open Resonator for frequencies ranging from 7.3 GHz to 50 GHz.

TABLE 3

| Freq. GHz | Average Dk | Average Df |
|---|---|---|
| 7.3 | 1.260 | 0.00070 |
| 9.2 | 1.260 | 0.00074 |
| 11.0 | 1.260 | 0.00077 |
| 20.4 | 1.254 | 0.00092 |
| 29.7 | 1.260 | 0.00094 |
| 31.6 | 1.260 | 0.00103 |
| 40.9 | 1.258 | 0.00107 |
| 50.3 | 1.257 | 0.00115 |

Example 13

(Dielectric Properties of Polyimide Aerogel Copper Clad Laminate)

The dielectric constant (Dk) and loss tangent (Df) of an etched sample of the polyimide aerogel copper clad laminate of thickness 161 micron of the polyimide aerogel film was measured at 10 GHz. The results were Dk 2.0 and Df 0.004.

The above specification and examples provide a complete description of the structure and use of illustrative embodiments. Although certain embodiments have been described above with a certain degree of particularity, or with reference to one or more individual embodiments, those of ordinary skill in the art could make numerous alterations to the disclosed embodiments without departing from the scope of this invention. As such, the various illustrative embodiments of the apparatuses and methods are not intended to be limited to the particular forms disclosed. Rather, they include all modifications and alternatives falling within the scope of the claims, and embodiments other than the ones shown may include some or all of the features of the depicted embodiments. For example, elements may be omitted or combined as a unitary structure, and/or connections may be substituted. Further, where appropriate, aspects of any of the examples described above may be combined with aspects of any of the other examples described to form further examples having comparable or different properties and/or functions and addressing the same or different problems. Similarly, it will be understood that the benefits and advantages described above may relate to one embodiment or may relate to several embodiments.

The claims are not intended to include, and should not be interpreted to include, means plus- or step-plus-function limitations, unless such a limitation is explicitly recited in a given claim using the phrase(s) "means for" or "step for," respectively.

The invention claimed is:
1. A laminate comprising:
at least two electrically-conductive layers comprising a first electrically-conductive layer and a second-electrically conductive layer, wherein the first electrically-conductive layer and the second electrically-conductive layer each comprise at least 90% by weight of copper; and
at least two electrically-insulative layers comprising a first electrically-insulative layer and a second electrically-insulative layer, wherein the first and second electrically-insulative layers are coupled by one or more adhesive layers to the first electrically-conductive layer and the second electrically-conductive layer, respectively; wherein the first electrically-insulative layer is coupled to the second electrically-insulative layer by an additional adhesive layer, and wherein the first and second electrically-insulative layers each comprise an organic polymeric aerogel,
wherein at least a portion of a front surface of the laminate is defined by the first electrically-conductive layer; and
wherein at least a portion of a back surface of the laminate is defined by the second electrically-conductive layer.

2. The laminate of claim 1, wherein at least one of the electrically-conductive layer(s) has a thickness that is between 0.5 mils and 0.9 mils.

3. The laminate of claim 1, wherein at least one of the electrically-conductive layer(s) has an area density of between 0.35 and 0.75 oz/ft$^2$ ounces per square foot (oz/ft$^2$).

4. The laminate of claim 1, wherein at least one of the organic polymeric aerogels comprises micropores, mesopores, and/or macropores.

5. The laminate of claim 4, wherein at least one of:
the organic polymeric aerogels has a pore volume; and
at least 10% of the pore volume is made up of macropores.

6. The laminate of claim 4, wherein at least one:
the organic polymeric aerogels has a pore volume; and
at least 10% of the pore volume is made up of micropores and/or mesopores.

7. The laminate of claim 1, wherein at least one of the organic polymeric aerogels has an average pore diameter that is between 100 nm and 800 nm.

8. The laminate of claim 1, wherein at least one of the polymeric aerogels comprises at least 90% by weight of the organic polymer.

9. The laminate of claim 1, wherein at least one of the organic polymeric aerogels comprises at least 90% by weight of polyimide.

10. The laminate of claim 1, wherein at least one of the organic polymeric aerogel has a thickness that is between 3.0 mils and 7.0 mils.

11. The laminate of claim 1, wherein at least one of the organic polymeric aerogel is a polyimide aerogel having a decomposition temperature that is greater than or equal to 400° C.

12. The laminate of claim 1, wherein at least one of the adhesive layer(s) or the additional adhesive layer comprises a fluoropolymer film.

13. The laminate of claim 1, wherein at least one of the adhesive layer(s) or the additional adhesive layer comprises a polyimide film.

14. The laminate of claim 1, wherein at least one of the adhesive layer(s) or the additional adhesive layer comprises a B-stage epoxy.

15. The laminate of claim 1, wherein at least one of the adhesive layer(s) between the electrically-conductive layer(s) and the electrically-insulating layer(s) has a dielectric constant at 10 GHz that is less than or equal to 3.5, a dissipation factor at 10 GHz that is less than or equal to 0.0040, a decomposition temperature that is greater than or equal to 350° C., and a melting point that is greater than or equal to 100° C.

16. The laminate of claim 1, wherein at least one of the adhesive layer(s) or the additional adhesive layer has a thickness that is between 0.75 and 1.25 mils.

17. The laminate of claim 1, wherein the laminate has a thickness that is between 5.0 mils and 30 mils.

18. The laminate of claim 1, wherein the laminate is disposed in a roll such that a portion of the front surface of the laminate faces a portion of the back surface of the laminate.

19. The laminate of claim 1, wherein the laminate has a dielectric constant, at 10 GHz, that is less than or equal to 2.0.

20. The laminate of claim 1, wherein the laminate has a dissipation factor, at 10 GHz, that is less than or equal to 0.0025.

21. The laminate of claim 1, wherein:
the laminate comprises one or more reinforcing layers, wherein:
each of the reinforcing layer(s) has a flexural rigidity that is at least 10% larger than a flexural rigidity of each of the electrically-conductive layer(s) and the electrically-insulative layer(s);
for at least one of the electrically-insulative layer(s), at least one of the reinforcing layer(s) is at least partially embedded in the layer of the organic polymeric aerogel such that the Young's modulus of the electrically-insulative layer is at least 200 MPa; and
for at least one of the electrically-insulative layer(s), a plurality of fibers are dispersed in the layer of the organic polymeric aerogel such that the Young's modulus of the electrically-insulative layer is at least 200 MPa.

22. The laminate of claim 21, wherein at least one of the reinforcing layer(s) comprises one or more unidirectional, woven, or nonwoven sheets that comprise fibers and/or one or more paper sheets.

23. The laminate of claim 1, wherein the laminate does not comprise fibers.

24. A circuit board comprising:
the laminate of claim 1; and
for at least one of the front and back surfaces, a solder mask layer bonded to the surface such that the solder mask layer covers at least a majority of the surface, the solder mask layer comprising at least 90% by weight of polymer.

25. The circuit board of claim 24, wherein a thickness of the solder mask layer is less than or equal to 3.2 mils.

26. An apparatus comprising the circuit board of claim 24, wherein:
the apparatus comprises an antenna electrically coupled to the circuit board; and/or
the apparatus is an electrical amplifier, a radar system, or a communication system.

* * * * *